United States Patent
Ono et al.

(10) Patent No.: US 7,663,186 B2
(45) Date of Patent: Feb. 16, 2010

(54) SEMICONDUCTOR DEVICE

(75) Inventors: Syotaro Ono, Kanagawa (JP); Yoshihiro Yamaguchi, Saitama (JP); Yusuke Kawaguchi, Kanagawa (JP); Kazutoshi Nakamura, Kanagawa (JP); Norio Yasuhara, Kanagawa (JP); Kenichi Matsushita, Tokyo (JP); Shinichi Hodama, Kanagawa (JP); Akio Nakagawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/118,159

(22) Filed: May 9, 2008

(65) Prior Publication Data

US 2008/0251838 A1    Oct. 16, 2008

Related U.S. Application Data

(62) Division of application No. 10/400,625, filed on Mar. 28, 2003, now abandoned.

(30) Foreign Application Priority Data

Mar. 29, 2002    (JP) .............................. 2002-094361

(51) Int. Cl.
*H01L 29/76*    (2006.01)
*H01L 29/94*    (2006.01)

(52) U.S. Cl. .................. 257/341; 257/342; 257/330; 438/270

(58) Field of Classification Search ......... 257/341–342, 257/328–330, E29.256, E29.257, E29.261; 438/270
See application file for complete search history.

(56) References Cited

U.S. PATENT DOCUMENTS

| 4,455,565 A | 6/1984 | Goodman et al. |
| 4,974,059 A | 11/1990 | Kinzer |
| 5,814,859 A | 9/1998 | Ghezzo et al. |
| 6,455,892 B1 | 9/2002 | Okuno et al. |
| 6,693,323 B2 | 2/2004 | Sato et al. |
| 2002/0185679 A1* | 12/2002 | Baliga .................. 257/329 |

FOREIGN PATENT DOCUMENTS

| JP | 59-167066 | 9/1984 |
| JP | 64-005070 | 1/1989 |
| JP | 01-253966 | 10/1989 |
| JP | 9-82965 | 3/1997 |
| JP | 2001-168335 | 6/2001 |

OTHER PUBLICATIONS

Shenoy, Praveen M., et al., "Analysis of the Effect of Charge Imbalance on the Static and Dynamic Characteristics of the Super Junction MOSFET", Industrial Power Product Development, Harris Semiconductor, Mountaintop, PA 18701, IEEE0-7803-5290-4/99, pp. 99-102, 1999.

Fujihara, Tatsuhiko, "Theory of Semiconductor Superjunction Devices", Jpn. J. Appl. Phys. vol. 36 (1997), pp. 6254-6262, Part I, No. 10, Oct. 1997.

* cited by examiner

*Primary Examiner*—Theresa T Doan
(74) *Attorney, Agent, or Firm*—Oblon, Spivak, McClelland, Maier & Neustadt, L.L.P.

(57) ABSTRACT

A semiconductor device includes: a substrate, a surface portion thereof serving as a drain layer; a first main electrode connected to the drain layer; an epitaxial layer formed on the drain layer; a base layer formed on the epitaxial layer; a source layer formed in a base layer surface portion; an insulated trench sandwiched by base layers; a JFET layer formed on trench side walls; an LDD layer formed in a base layer surface portion and connected to the JFET layer around a top face of the trench; a control electrode formed on a gate insulating film formed on an LDD layer surface part, on surfaces of source layer end parts facing each other across the trench, and on a base layer region sandwiched by the LDD and source layers; and a second main electrode connected to the source and base layers sandwiching the control electrode.

18 Claims, 20 Drawing Sheets

SEMICONDUCTOR DEVICE

CROSS REFERENCE TO RELATED APPLICATION

This application is a Divisional of U.S. application Ser. No. 10/400,625, filed on Mar. 28, 2003, and claims benefit of priority to Japanese patent application No. 2002-94361, filed on Mar. 29, 2002, the contents of both of which are incorporated by reference herein.

BACKGROUND OF THE INVENTION

1. Field of the Invention

The present invention relates to a semiconductor device and, more particularly, to a semiconductor device having a power MOSFET (Metal Oxide Semiconductor Field Effect Transistor) structure.

2. Related Background Art

In recent years, demand for a power MOSFET has been rapidly increasing in the field of a switching power source of heavy current and high breakdown voltage and, in addition, in the field of switching elements for energy saving of mobile communication devices such as a notebook-sized PC (Personal Computer). Since the power MOSFET is often used for a power management circuit, a safety circuit of a lithium ion battery, and the like in these fields, driving with a lower voltage so that the device can be directly driven with a battery voltage, lower ON-state resistance, reduction in capacitance $Q_{gd}$ between a gate and a drain for reducing a switching loss, and the like are strongly demanded.

A conventional vertical-type power MOSFET will be described with reference to a schematic cross section of FIG. 26. In the following diagrams, like parts are designated by like reference numerals and repetitive descriptions thereof will be appropriately omitted.

In a power MOSFET 100 shown in FIG. 26, a drain electrode 12 is provided on the under face of an n$^+$ type low-resistance semiconductor substrate 10, and an n$^-$ type high-resistance epitaxial layer 50 is formed on the top face of the low-resistance semiconductor substrate 10. In a surface portion of the high-resistance epitaxial layer 50, a p type base layer 14 is selectively formed. In a surface portion of the p type base layer 14, an n$^+$ type source layer 16 is selectively formed. In a surface portion of the p type base layer 14, a highly-doped p type region 18 is selectively formed so as to be adjacent to the n$^+$ type source layer 16. In the surface portion of the high-resistance epitaxial layer 50, in a region sandwiched by the p-type base layers 14, an Njfet region 90 is selectively formed, into which an n-type impurity is doped at a higher concentration as compared with the high-resistance epitaxial layer 50. On the surface of the Njfet region 90, the surfaces of the p-type base layers 14 sandwiching the Njfet region 90, and the surfaces of end portions of the n$^+$ type source layers 16 facing each other so as to sandwich the Njfet region 90, a gate electrode 94 is provided via a gate insulating film 92. On the surfaces of the n$^+$ type source layers 16 and the surfaces of the highly-doped p type regions 18, source electrodes 20 are provided so as to sandwich the gate electrode 94.

For the power MOSFET 100 having such a structure, it is necessary to make the Njfet region 90 easily depleted in order to reduce the gate-drain capacitance $Q_{gd}$.

However, when the impurity concentration of the Njfet region 90 is lowered to make the Njfet region 90 easily depleted, a problem occurs such that an ON-state resistance Ron of the device increases and, as a result, a breakdown voltage of the device decreases.

BRIEF SUMMARY OF THE INVENTION

According to a first aspect of the invention, there is provided a semiconductor device comprising: a semiconductor substrate, at least a surface portion thereof serving as a low-resistance drain layer of a first conductivity type; a first main electrode connected to the low-resistance drain layer; a high-resistance epitaxial layer of the first conductivity type formed on the low-resistance drain layer; a second-conductivity type base layer selectively formed in a surface portion of the high-resistance epitaxial layer; a first-conductivity type source layer selectively formed in a surface portion of the second-conductivity type base layer; a jfet layer of the first conductivity type selectively formed in a region sandwiched by the second-conductivity type base layers in a surface portion of the high-resistance epitaxial layer and having impurity concentration higher than that of the high-resistance epitaxial layer; a gate insulating film formed on at least a part of the surface of the first-conductivity type jfet layer, on the surfaces of the second-conductivity type base layers facing each other across the first-conductivity type jfet layer, and on the surfaces of end portions of the first-conductivity type source layers facing each other across the first-conductivity type jfet layer; a control electrode formed on the gate insulating film; and a second main electrode in ohmic contact with the first-conductivity type source layer and the second-conductivity type base layer so as to sandwich the control electrode, wherein assuming that depth of the second-conductivity type base layer is Xj, width L of the first-conductivity type jfet layer in the direction orthogonal to the longitudinal direction of the control electrode is substantially equal to or less than that of an interval between neighboring control electrodes and satisfies the following expression.

$L \leq Xj \times 0.7$

According to a second aspect of the invention, there is provided a semiconductor device comprising: a semiconductor substrate, at least a surface portion thereof serving as a low-resistance drain layer of a first conductivity type; a first main electrode connected to the low-resistance drain layer; a high-resistance epitaxial layer of the first conductivity type formed on the low-resistance drain layer; a second-conductivity type base layer selectively formed in a surface portion of the high-resistance epitaxial layer; a first-conductivity type source layer selectively formed in a surface portion of the second-conductivity type base layer; a jfet layer of the first conductivity type selectively formed in a region sandwiched by the second-conductivity type base layer in the surface portion of the high-resistance epitaxial layer and having impurity concentration higher than that of the high-resistance epitaxial layer; a gate insulating film formed on at least a part of the surface of the first-conductivity type jfet layer, on the surfaces of the second-conductivity type base layers facing each other across the first-conductivity type jfet layer, and on the surfaces of end portions of the first-conductivity type source layers facing each other across the first-conductivity type jfet layer; a control electrode formed on the gate insulating film; and; a second main electrode in ohmic contact with the first-conductivity type source layer and the second-conductivity type base layer so as to sandwich the control electrode, wherein the second-conductivity type base layers sandwiching the first-conductivity type jfet layer are disposed close to each other so that depletion from the second-conductivity type base layer becomes dominant, and the gate insulating film and the control electrode are formed by selectively removing a part of a region facing the first-conductivity type jfet layer.

According to a third aspect of the invention, there is provided a semiconductor device comprising: a semiconductor substrate, at least a surface portion thereof serving as a low-resistance drain layer of a first conductivity type; a first main electrode connected to the low-resistance drain layer; a high-resistance epitaxial layer of a second-conductivity type formed on the low-resistance drain layer; a second-conductivity type base layer selectively formed on the high-resistance epitaxial layer; a first-conductivity type source layer selectively formed in a surface portion of the second-conductivity type base layer; a trench formed in a region sandwiched by the second-conductivity type base layers with a depth extending from the surface of the high-resistance epitaxial layer to the semiconductor substrate; a jfet layer of the first conductivity type formed on side walls of the trench; an insulating layer formed in the trench; an LDD layer of the first-conductivity type formed in a surface portion of the second-conductivity type base layer so as to be connected to the first-conductivity type jfet layer around a top face of the trench; a control electrode formed above the semiconductor substrate so as to be divided into a plurality of parts, and formed on a gate insulating film formed on a part of the surface of the LDD layer, on surfaces of end parts of the first-conductivity type source layer facing each other across the trench, and on a region of the surface of the second-conductivity type base layer sandwiched by the LDD layer and the first-conductivity type source layer; and a second main electrode in ohmic contact with the first-conductivity type source layer and the second-conductivity type base layer so as to sandwich the control electrode.

According to a fourth aspect of the invention, there is provided a semiconductor device comprising: a semiconductor substrate, at least a surface portion thereof serving as a low-resistance drain layer of a first conductivity type; a first main electrode connected to the low-resistance drain layer; a first insulating layer formed on the low-resistance drain layer; a second-conductivity type base layer formed on the first insulating layer; a first-conductivity type source layer selectively formed in a surface portion of the second-conductivity type base layer; a trench formed so as to extend from the surface of the second-conductivity type base layer to the semiconductor substrate; a jfet layer of the first conductivity type formed on side walls of the trench; a second insulating layer formed in the trench; an LDD layer of the first conductivity type formed in a surface portion of the second-conductivity type base layer so as to be connected to the jfet layer of the first conductivity type around a top face of the trench; a control electrode formed so as to be divided into a plurality of parts above the semiconductor substrate, and formed on a gate insulating film formed on a part of the surface of the LDD layer, on surfaces of end portions of the first-conductivity type source layer facing each other across the trench, and on a region of the second-conductivity type base layer sandwiched by the LDD layer and the first-conductivity type source layer; and a second main electrode in ohmic contact with the first-conductivity type source layer and the second-conductivity type base layer so as to sandwich the control electrode.

DETAILED DESCRIPTION OF THE INVENTION

Embodiments of the invention will be described in detail hereinbelow with reference to the drawings.

(1) FIRST EMBODIMENT

Figure 1:
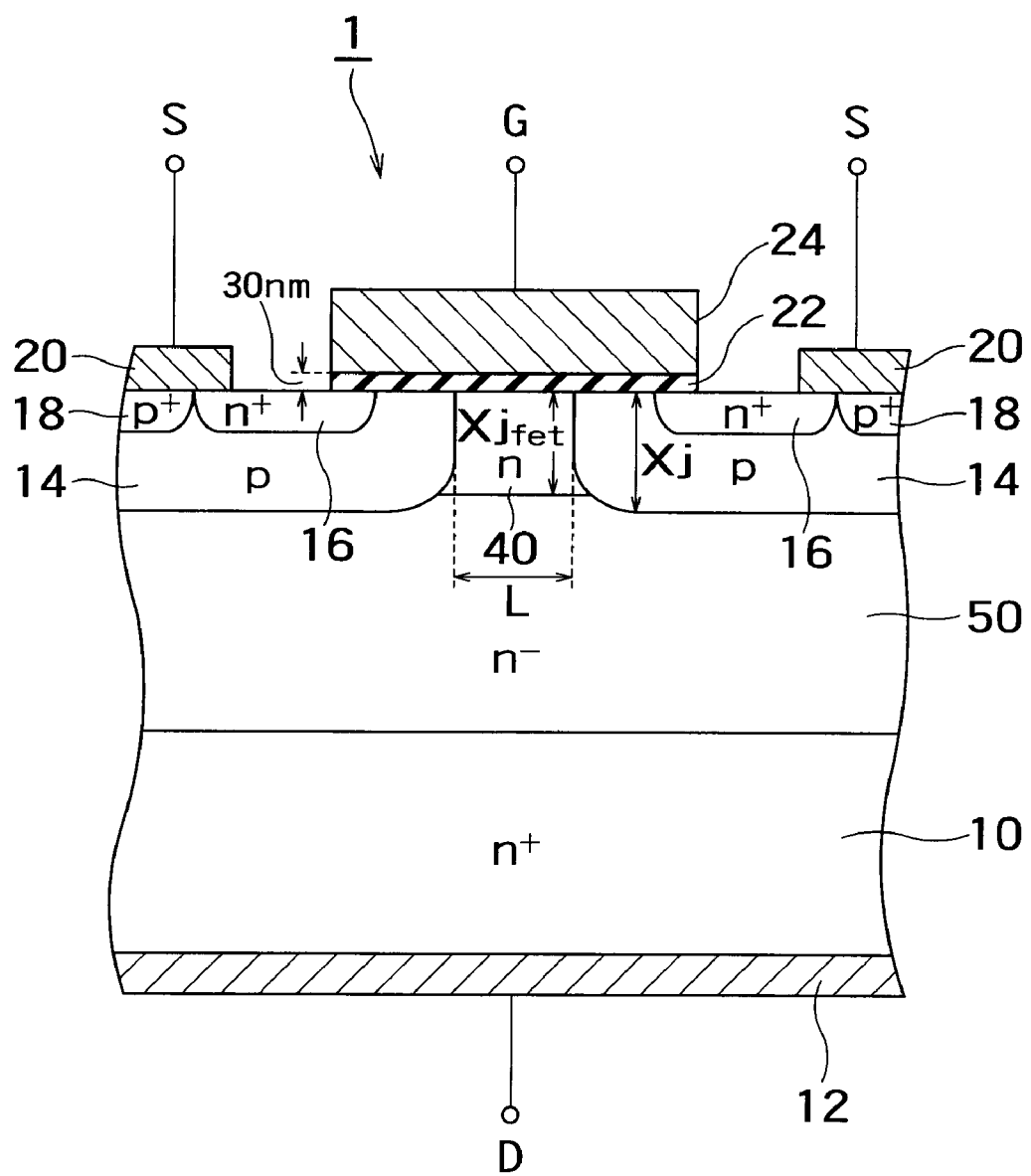
FIG. 1 is a schematic cross section showing a first embodiment of a semiconductor device according to the invention.

FIG. 1 is a schematic cross section showing a first embodiment of a semiconductor device according to the invention. The semiconductor device of the present embodiment is characterized in that an Njfet region 40 is formed in a narrow width at a high concentration. The structure of the semiconductor device of the embodiment will be described in more detail hereinbelow.

A power MOSFET 1 shown in FIG. 1 is a power MOSFET of a vertical type to which the invention is applied, and includes an n+ type low-resistance semiconductor substrate 10, a drain electrode 12, an n− type high-resistance epitaxial layer 50, a p type base layer 14, an n+ type source layer 16, the Njfet region 40, a gate electrode 24, and a source electrode 20.

The drain electrode 12 is provided on one of the surfaces (under face in FIG. 1) of the n+ type low-resistance semiconductor substrate 10, and the n− type high-resistance epitaxial layer 50 is formed on the other face (top face in FIG. 1) of the n+ type low-resistance semiconductor substrate 10. The p type base layer 14 is selectively formed in a surface portion of the n− type high-resistance epitaxial layer 50, and the n+ type source layer 16 is selectively formed in a surface portion of the p type base layer 14. In the surface portion of the p type base layer 14, the highly-doped p type region 18 is formed. The Njfet region 40 is selectively formed in a region sandwiched by the p type base layers 14 in the surface portion of the n− type high-resistance epitaxial layer 50. A gate electrode 24 is provided via a gate insulating film 22 on the surface of the Njfet region 40, on the surfaces of the regions of the p type base layer 14 sandwiching the Njfet region 40, and on the surfaces of end portions of the n+ type source layers 16 facing each other across the Njfet region 40. The source electrodes 20 are provided on the surfaces of the n+ type source layers 16 and the surfaces of the highly-doped p type regions 18 so as to sandwich the gate electrode 24.

Figure 26:
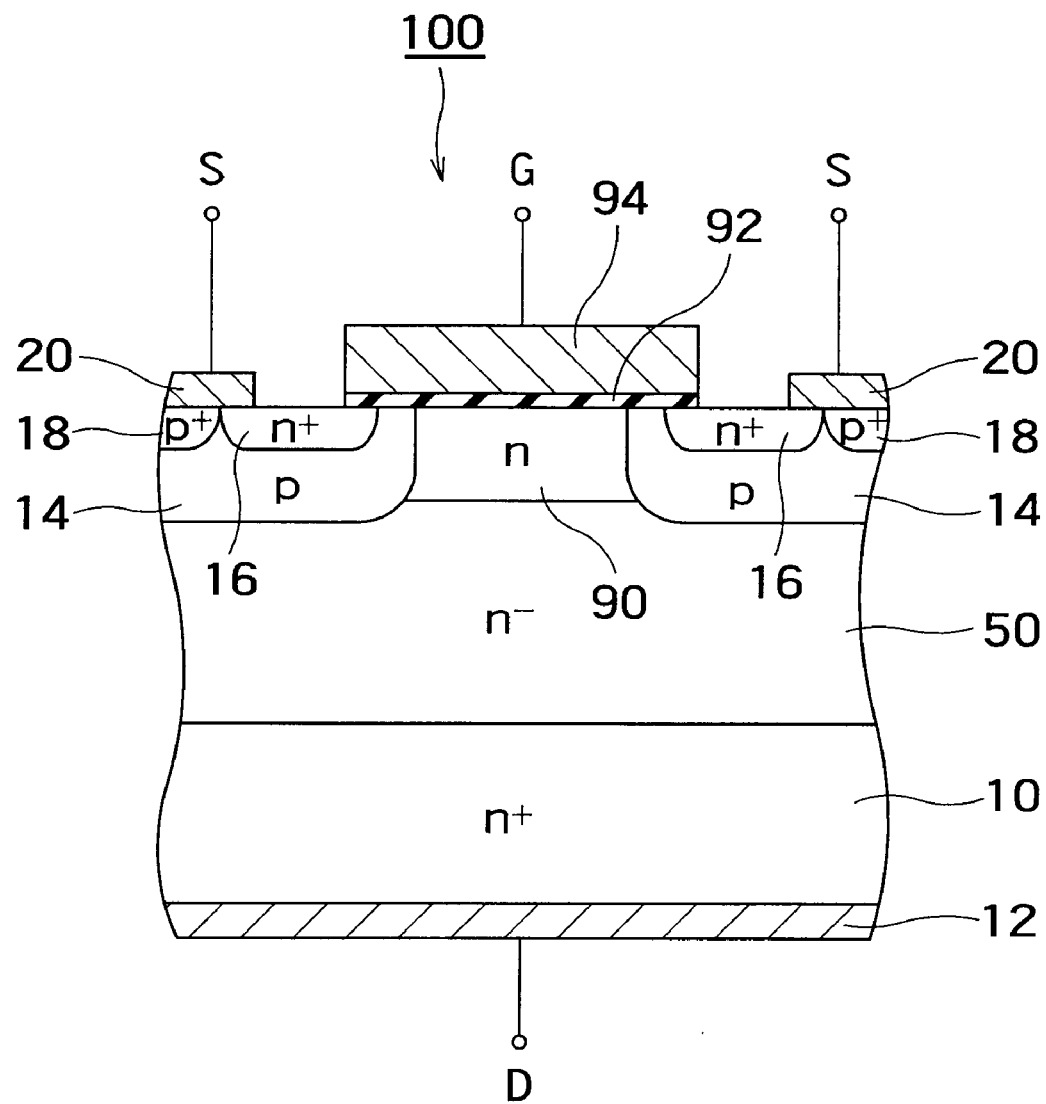
FIG. 26 is a schematic cross section showing an example of a conventional vertical-type power MOSFET.

The Njfet region 40 is a characteristic part in the embodiment and, as obviously understood by comparison with FIG. 26, the Njfet region 40 is formed so as to be narrower than the Njfet region 90 of the conventional power MOSFET. The width L of the Njfet region 40 is substantially equal to or narrower than the spacing between two neighboring gate electrodes 24. By forming the Njfet region 40 so as to have such a narrow width L, a structure is obtained with which an amount contributed to the gate-drain capacitance $Q_{gd}$ by the gate electrode 24 decreases and depletion from the neighboring p type base layers 14 becomes dominant in depletion of the Njfet region 40. More specifically, a simulation shows that the width L of the Njfet region 40 satisfies the relation of $L \leq 1.0 \, \mu m$ when depth Xj of the p type base layer 14 is 1.0 μm.

Figure 2:
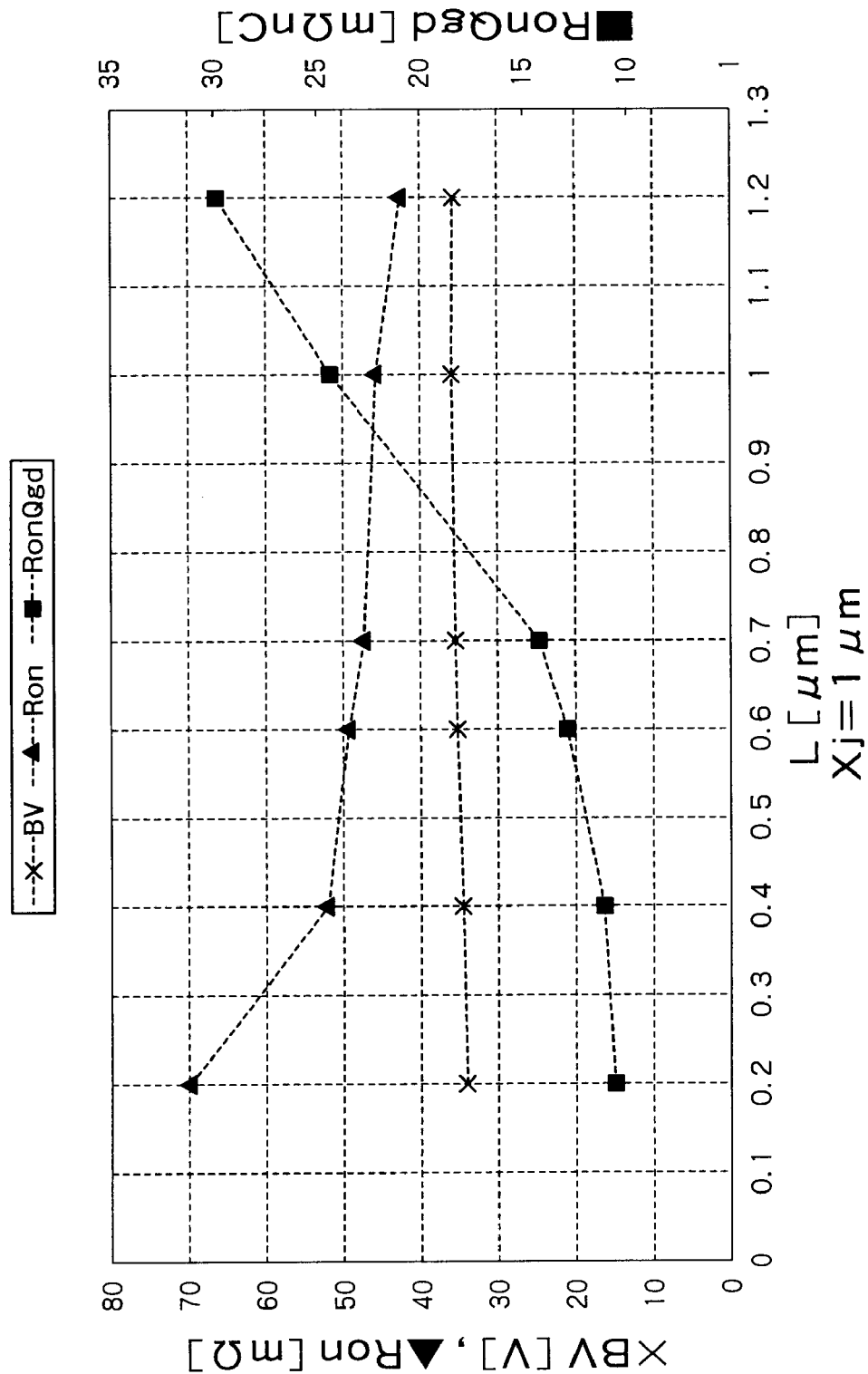
FIG. 2 is a graph showing a simulation result of width L of an Njfet region in the semiconductor device illustrated in FIG. 1.

FIG. 2 is a graph showing a result of the simulation of the width L of the Njfet region 40. When the gate insulating film 22 is formed in almost uniform thickness of about 30 nm, $R_{on}Q_{gd}$ is about 24 [mΩnC] or less in the region satisfying the relation of $L \leq 1.0 \, \mu m$ as shown in FIG. 2. It is understood that particularly in the region satisfying the relation of Xj×0.7 or less, conspicuous effects appear on both $R_{on}Q_{gd}$ and a breakdown voltage BV.

Referring again to FIG. 1, the Njfet region 40 is formed with a depth almost equal to the depth Xj of the p type base layer 14. The Njfet region 40 is also formed so that the junction interface thereof with the p-type base layer 14 becomes perpendicular to the surface of the Njfet region 40 as it approaches the surface.

By narrowing the width L of the Njfet region 40 as described above, the surface density of the Njfet region 40 can be increased to the range from about 1E16 to about 3E17 [$cm^{-3}$], so that on-state resistance $R_{on}$ can be also reduced.

Figure 3:
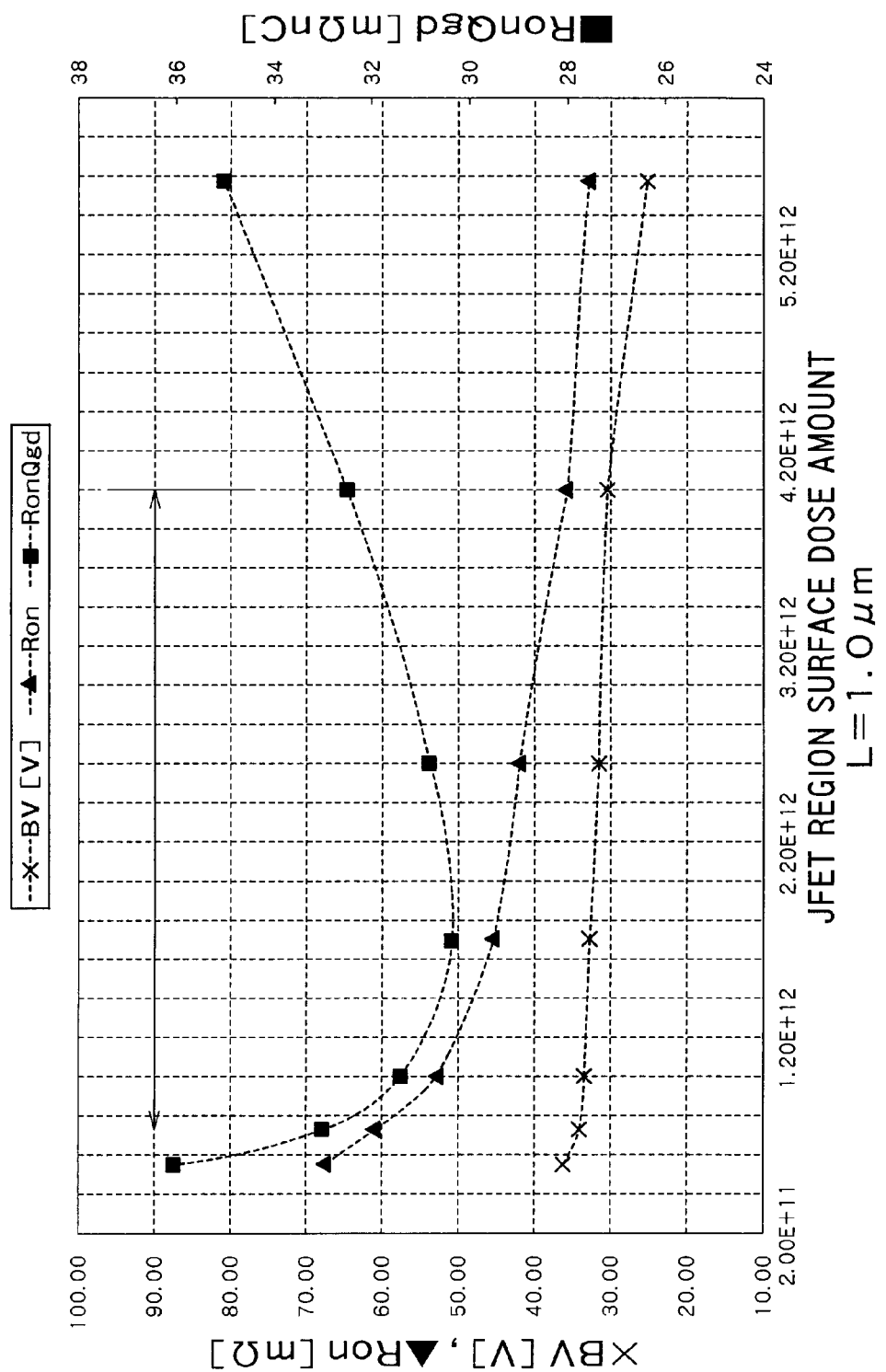
FIG. 3 is a graph showing a simulation result of the amount of a dose in the surface of the Njfet region in the semiconductor device illustrated in FIG. 1.

FIG. 3 is a graph showing a simulation result of the amount of a dose in the surface of the Njfet region 40. As shown in FIG. 3, the simulation teaches that, when the width L of the Njfet region 40 is 1 μm, the breakdown voltage BV of 30V or higher is obtained and the value of $R_{on}Q_{gd}$ is also low, over a range in which the amount N of the surface dose of the Njfet region 40 satisfies the relation of $N \leq 4E \times 12$.

(2) SECOND EMBODIMENT

Figure 4:
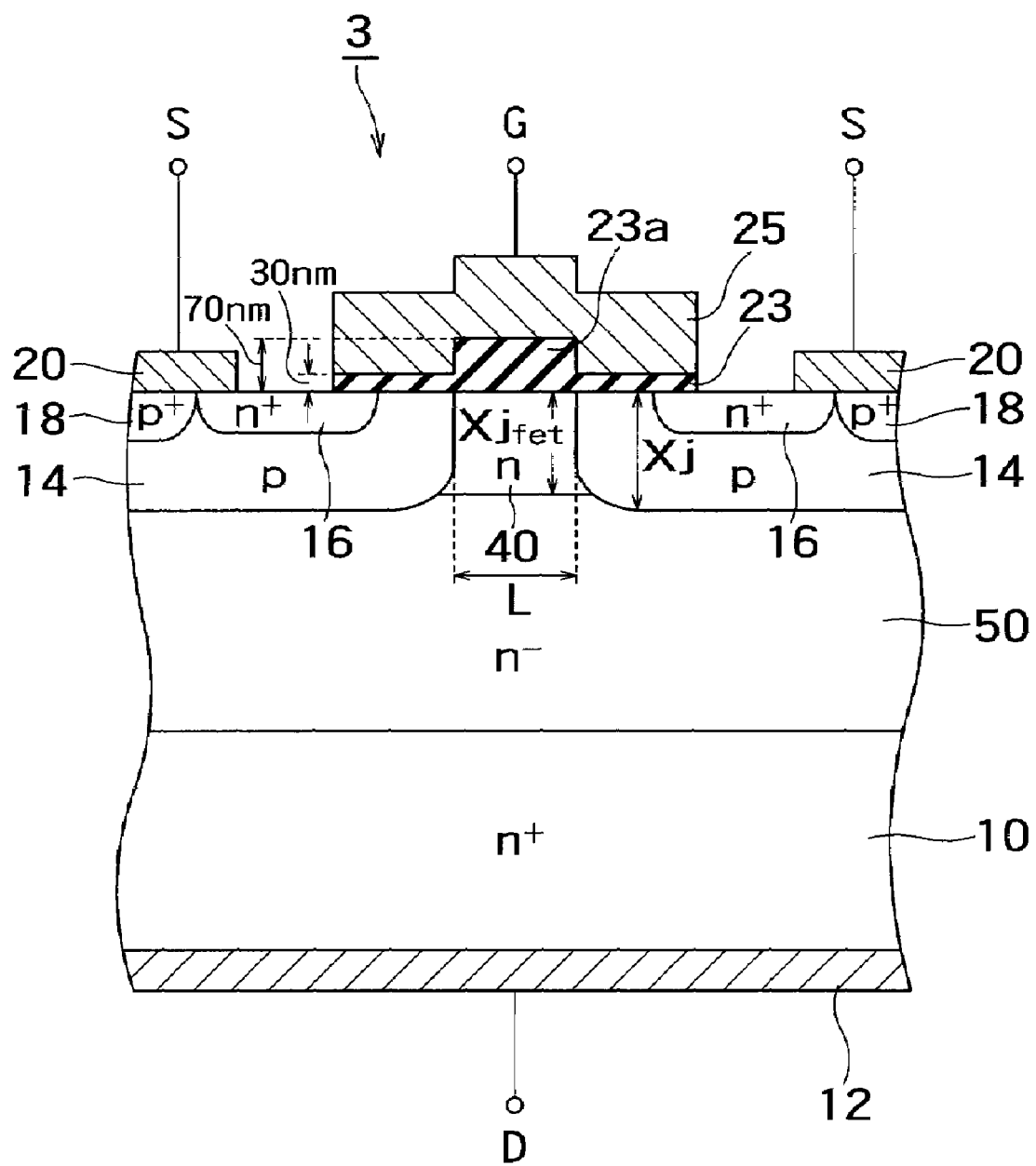
FIG. 4 is a schematic cross section showing a second embodiment of the semiconductor device according to the invention.

FIG. 4 is a schematic cross section showing a second embodiment of a semiconductor device according to the invention. As obviously understood from comparison with FIG. 1, a power MOSFET 3 of the second embodiment is characterized in that a gate insulating film 23 is formed so as to be thicker in a region facing the Njfet region 40 as well as in that the Njfet region 40 is formed in narrow width and at high concentration. More specifically, a portion 23a of the gate insulating film 23 facing the Njfet region 40 has a thickness of about 90 nm whereas the other portion of the gate insulating film 23 is formed to have a thickness of about 30 nm. By the configuration, in the region facing the Njfet region 40, a gate electrode 25 can be further isolated from the Njfet region 40.

Since the Njfet region 40 is formed in narrow width and at high concentration, at the time of depleting the Njfet region 40, depletion from the p type base layer 14 becomes dominant. Thus, it is possible to employ such structures of the gate insulating film 23 and the gate electrode 25.

In the power MOSFET 3 of the embodiment, the gate electrode 25 is provided via the gate insulating film 23 which is formed so that the region facing the Njfet region 40 is thicker than the other region. Thus, the amount of contribution to the gate-drain capacitance $Q_{gd}$ of the gate electrode can be further reduced.

(3) THIRD EMBODIMENT

Figure 5:
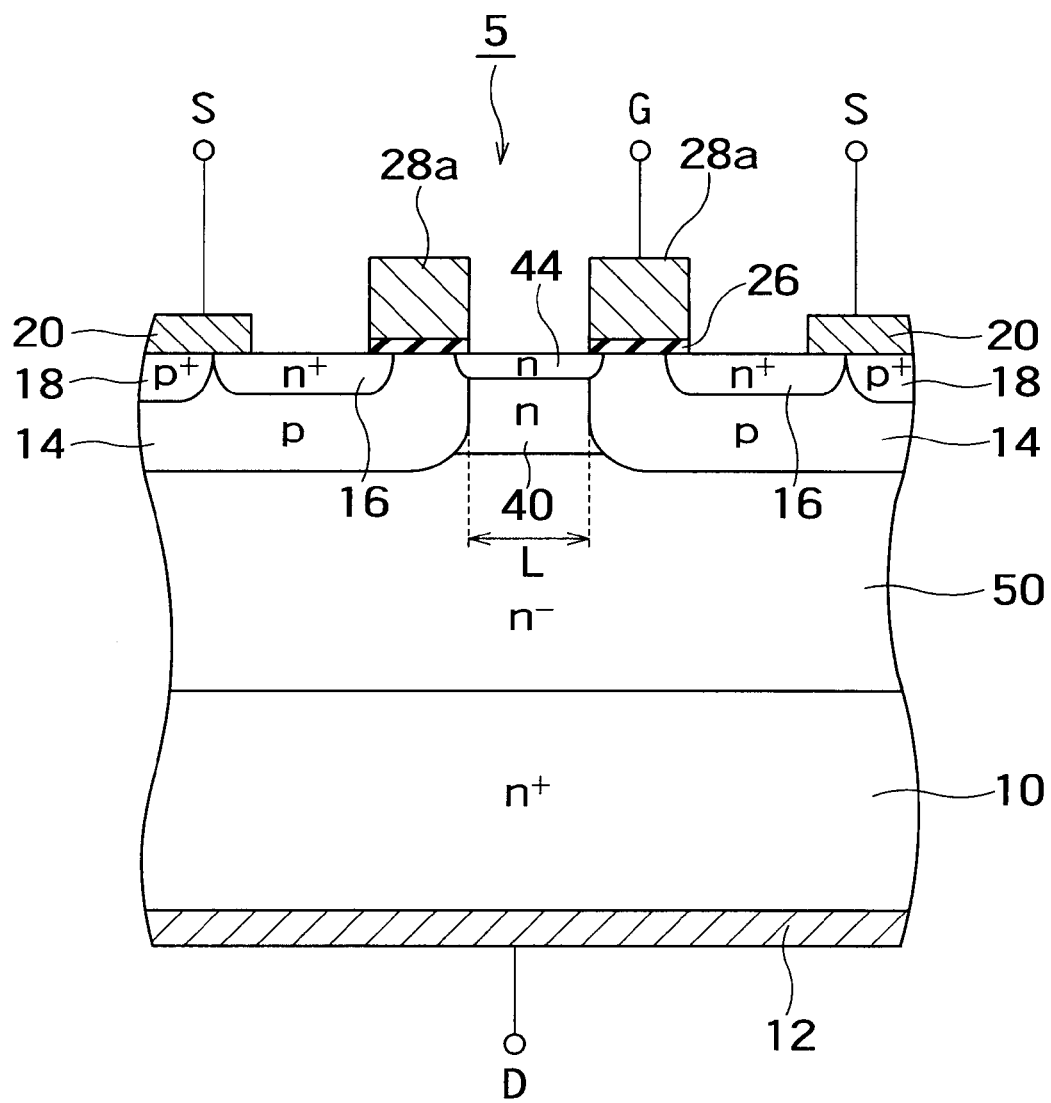
FIG. 5 is a schematic cross section showing a third embodiment of the semiconductor device according to the invention.

FIG. 5 is a schematic cross section showing a third embodiment of a semiconductor device according to the invention. As obviously understood by comparison with FIG. 1, a power MOSFET 5 of the third embodiment is characterized in that a portion facing the Njfet region 40 in the gate electrode 28 is selectively removed.

By employing the structure in which the gate electrode 28 is divided as described above, the width L of the Njfet region 40 can be further narrowed, so that the gate-drain capacitance $Q_{gd}$ is further reduced and operation speed of the device is further increased. By implanting n-type impurities using the gate electrode 28 in the divisional structure as a mask, the Njfet region 40 can be formed in a self-aligned manner.

Figure 6:
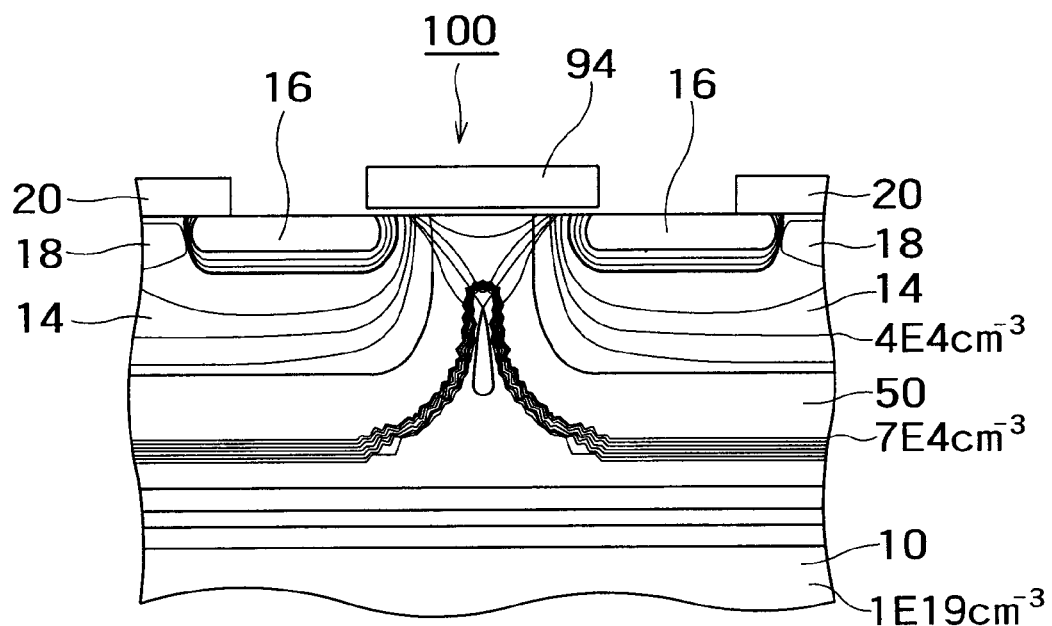
FIG. 6 is a diagram showing electron density in a conventional power MOSFET 100 illustrated in FIG. 26.
Figure 7:
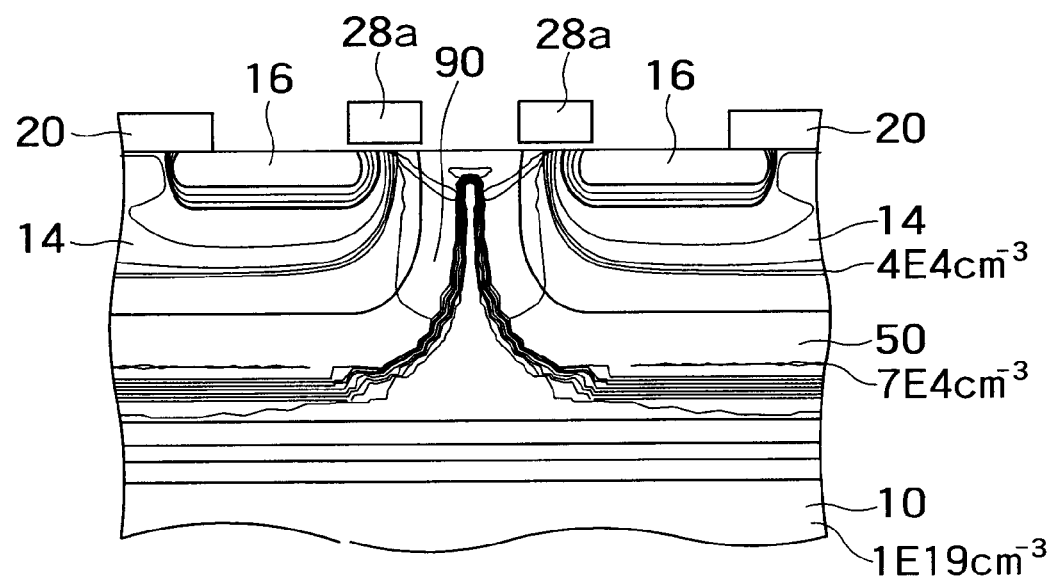
FIG. 7 is a diagram for explaining reduction in gate-drain capacitance $Q_{gd}$ by the semiconductor device illustrated in FIG. 5.

FIGS. 6 and 7 are diagrams for explaining reduction in the gate-drain capacitance $Q_{gd}$ according to the third embodiment. FIG. 6 shows electron density in the conventional power MOSFET 100 illustrated in FIG. 26, and FIG. 7 shows electron density in the case where the gate electrode of the power MOSFET 100 of FIG. 26 is simply divided without reducing the width L of the Njfet region. Each of FIGS. 6 and 7 shows electron density when 20V is applied as Vds.

As understood from comparison between FIG. 6 and FIG. 7, when the gate electrode 94 of the conventional power MOSFET 100 is simply divided, the ratio of depletion by the gate remains high due to the wide region between neighboring p type base layers 14. As a result, depletion from the gate does not occur, a breakdown voltage decreases.

Referring again to FIG. 5, the power MOSFET 5 of the embodiment further includes an LDD (Lightly Doped Drain) region 44 formed in the surface portion of the Nifet region 40. The LDD region 44 is formed in a self-aligned manner by shallowly implanting n-type impurity ions into the Njfet region 40 by using the divided gate electrode 28 as a mask and, after that, performing thermal diffusion.

Figure 8:
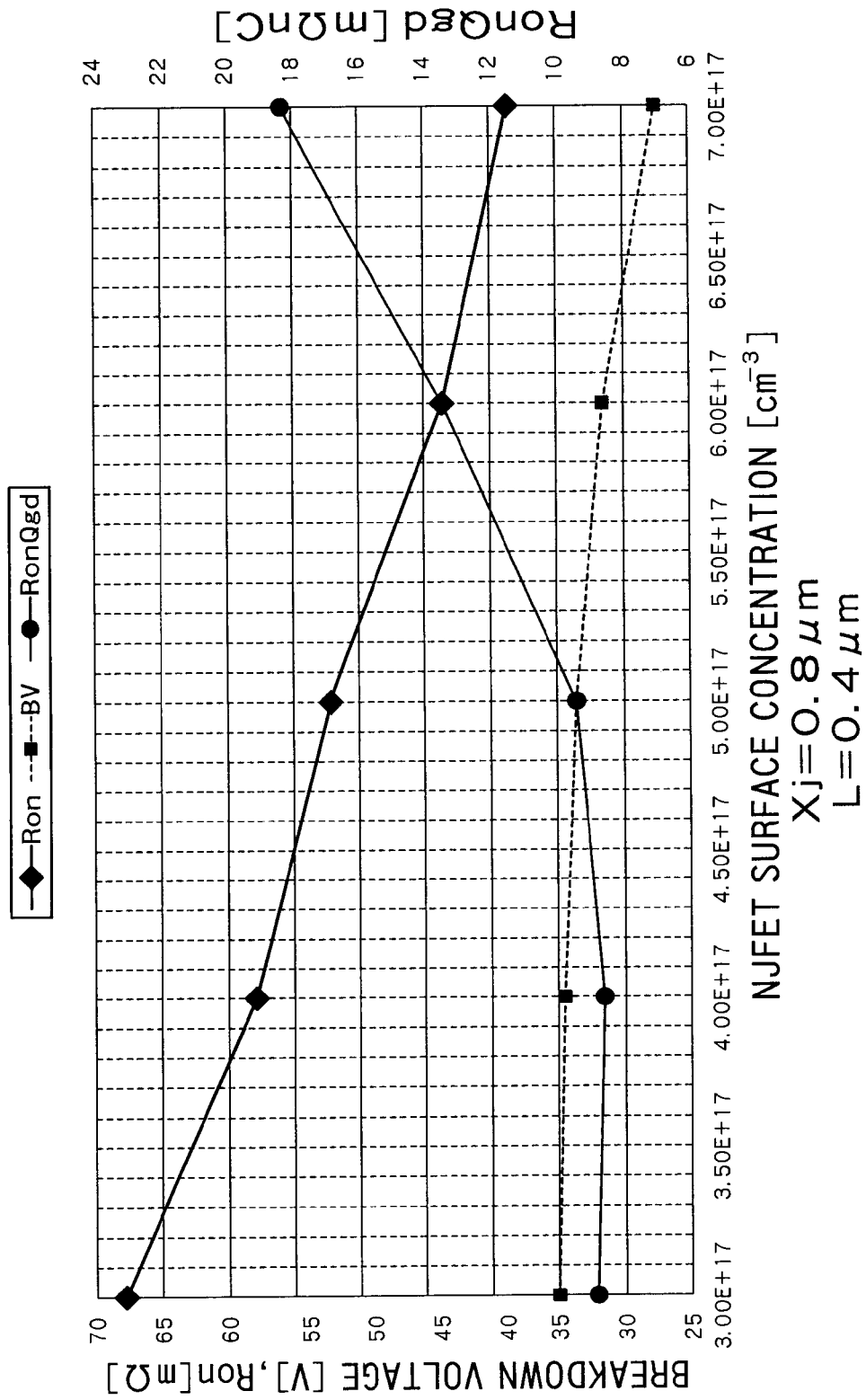
FIG. 8 is a graph showing a simulation result of a proper range of impurity concentration in an LDD region in the semiconductor device illustrated in FIG. 5.

FIG. 8 is a graph showing an appropriate range of impurity concentration in the LDD region 44 of the power MOSFET 5 obtained by a simulation. It is understood from the graph that, when $Xj=0.8$ μm and $L=0.4$ μm, the value of $R_{on}Q_{gd}$ can be set to 10 [mΩnC] or less by setting the upper limit of the impurity concentration Cs of the LDD region 44 to about 5E17 [cm$^{-3}$].

Referring to FIGS. 9 through 14, some plane shapes of the gate electrode of the power MOSFET 5 of the embodiment will be described.

Figure 9:
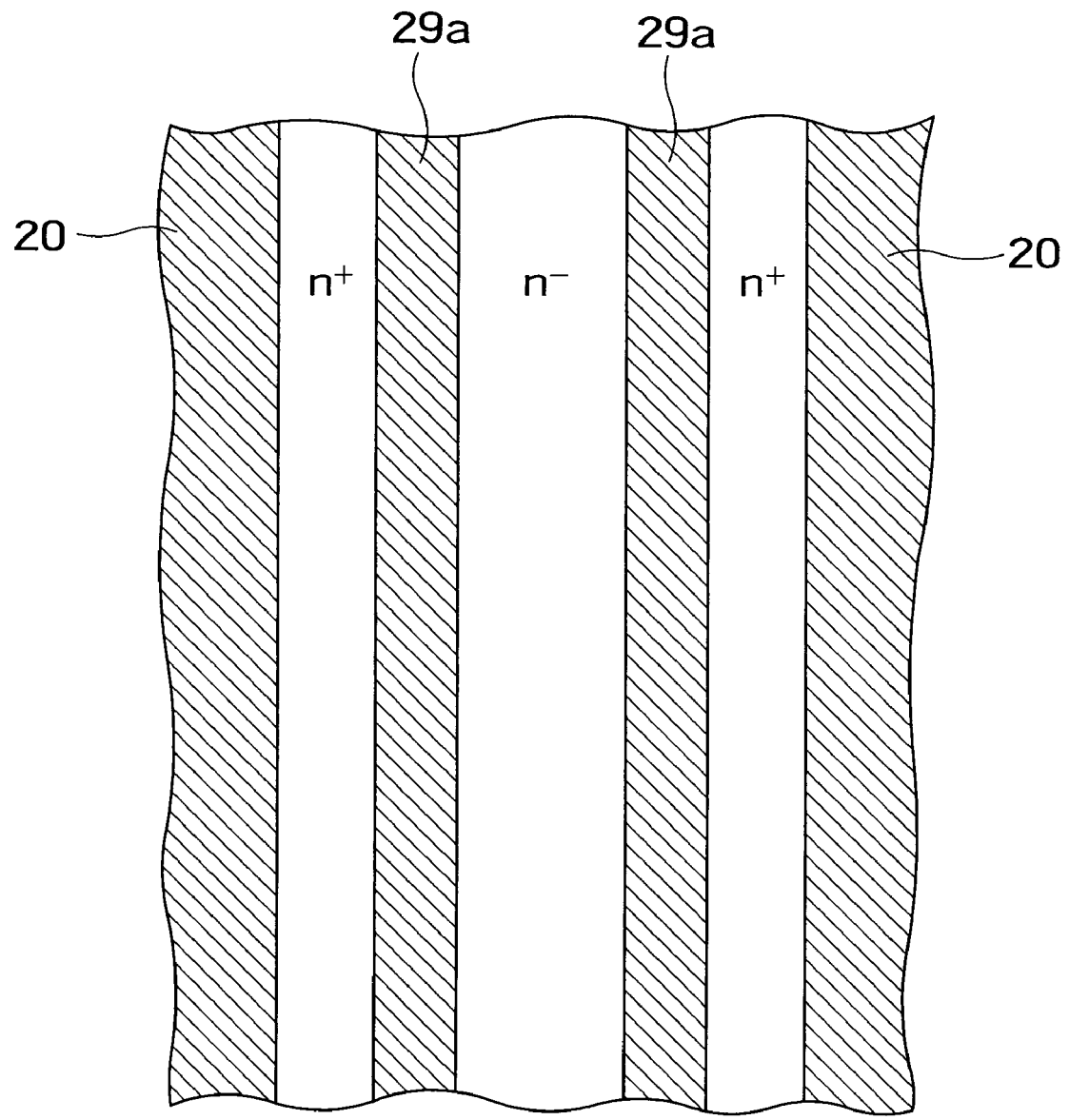
FIG. 9 is a plan view showing a first example of a plane shape of a gate electrode of the semiconductor device illustrated in FIG. 5.

FIG. 9 shows a plane shape of a gate electrode 29 as a first example. The gate electrode 29 of the example is divided into two parts and each part is formed so as to have a stripe pattern similar to the plane shape of the gate electrode of a conventional power MOSFET. Such an electrode shape has a drawback such that resistance of the gate electrode itself might become high and it might disturb increase in the processing speed of the device.

Figure 10:
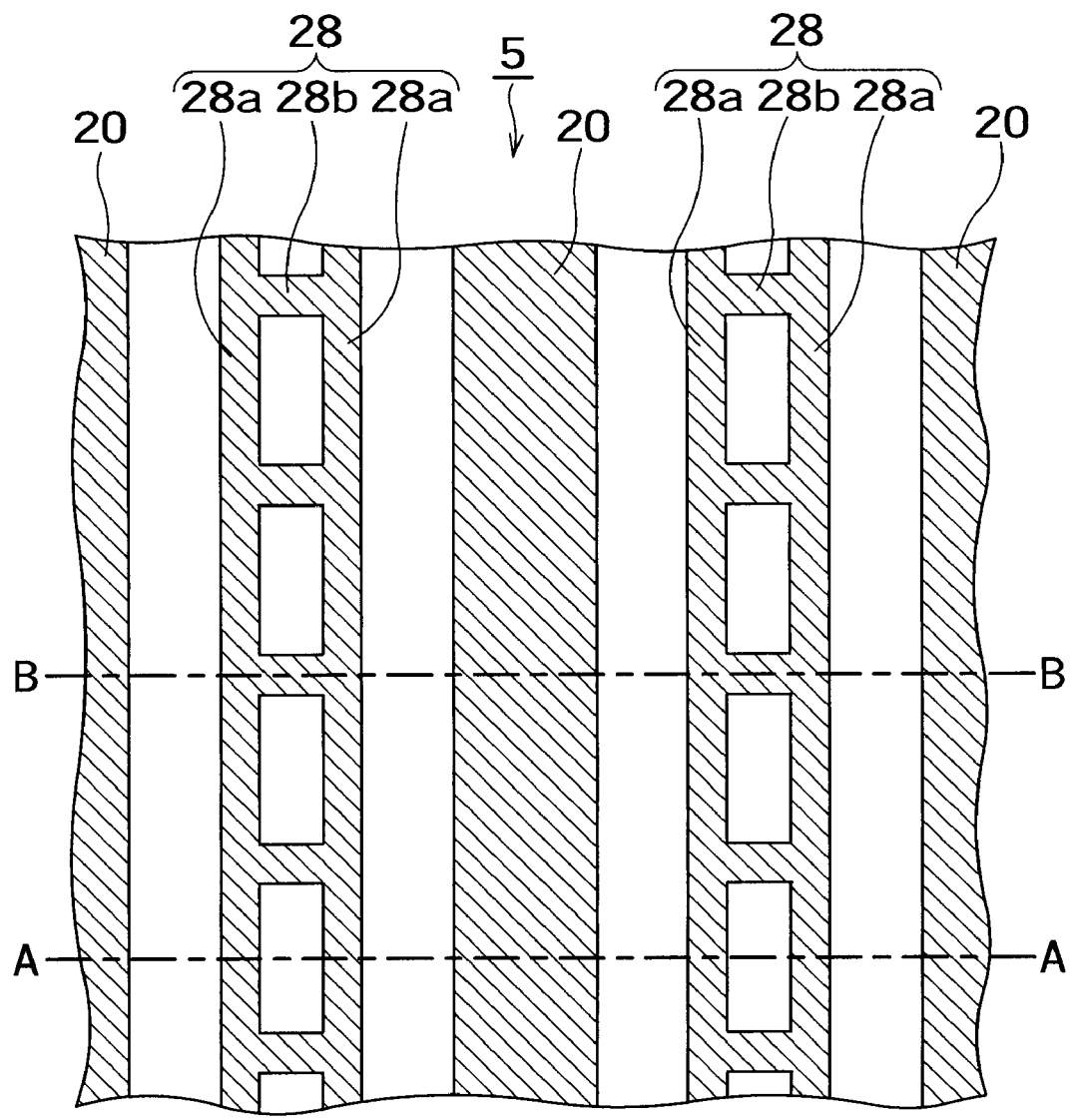
FIG. 10 is a plan view showing a second example of a plane shape of the gate electrode of the semiconductor device illustrated in FIG. 5.
Figure 11:
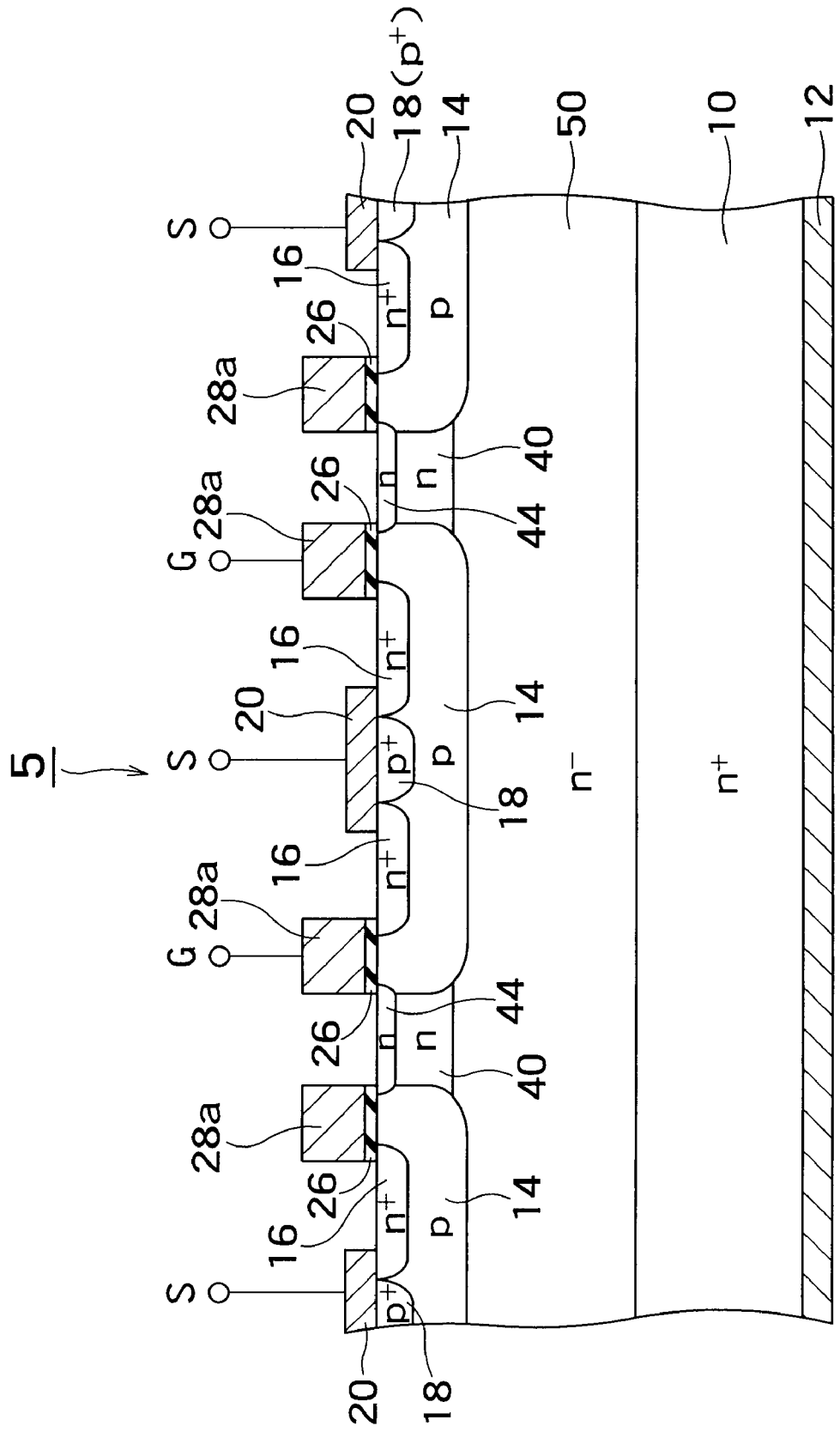
FIG. 11 is a schematic cross section taken along line A-A of FIG. 10.
Figure 12:
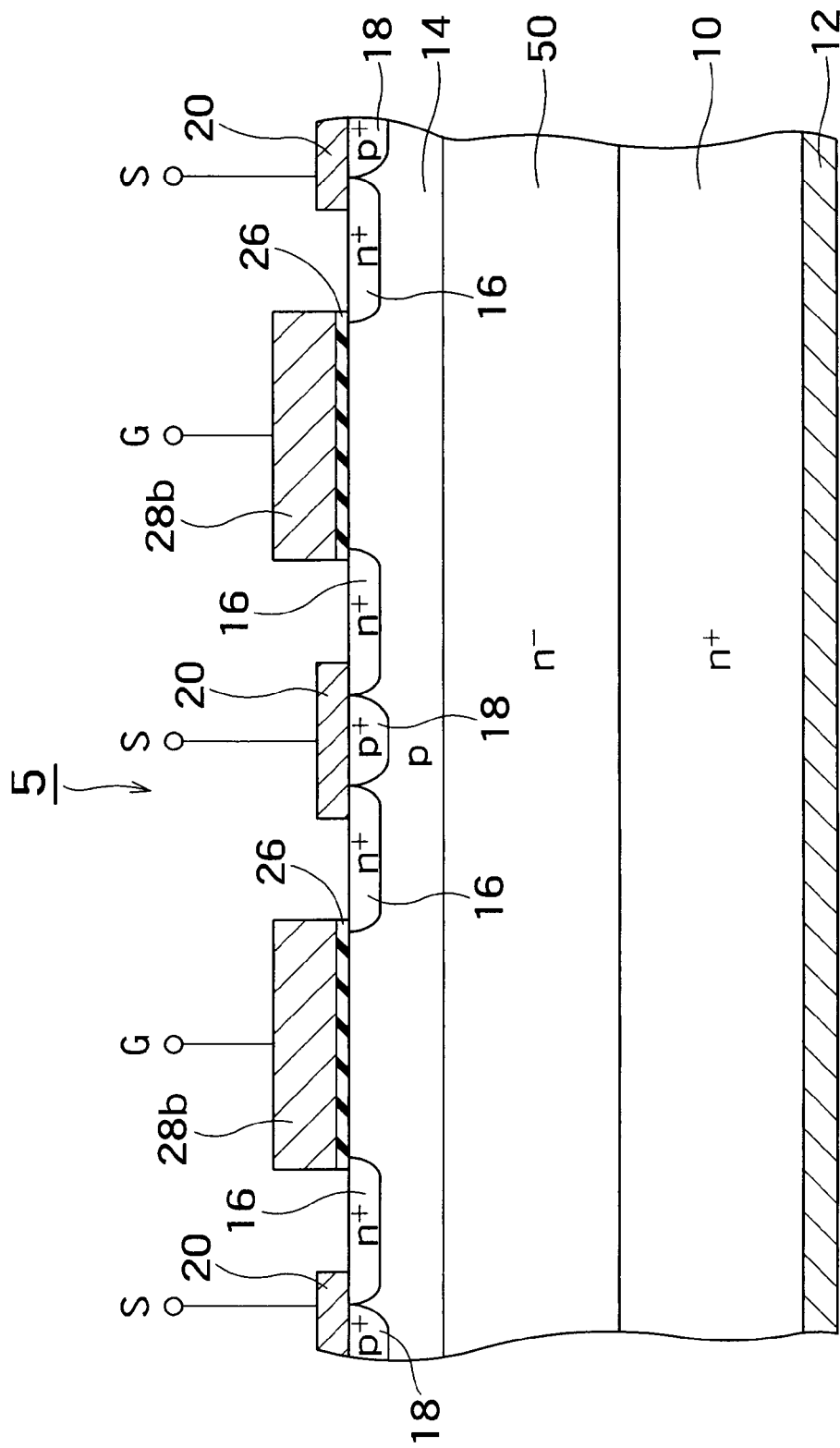
FIG. 12 is a schematic cross section taken along line B-B of FIG. 10.
Figure 13:
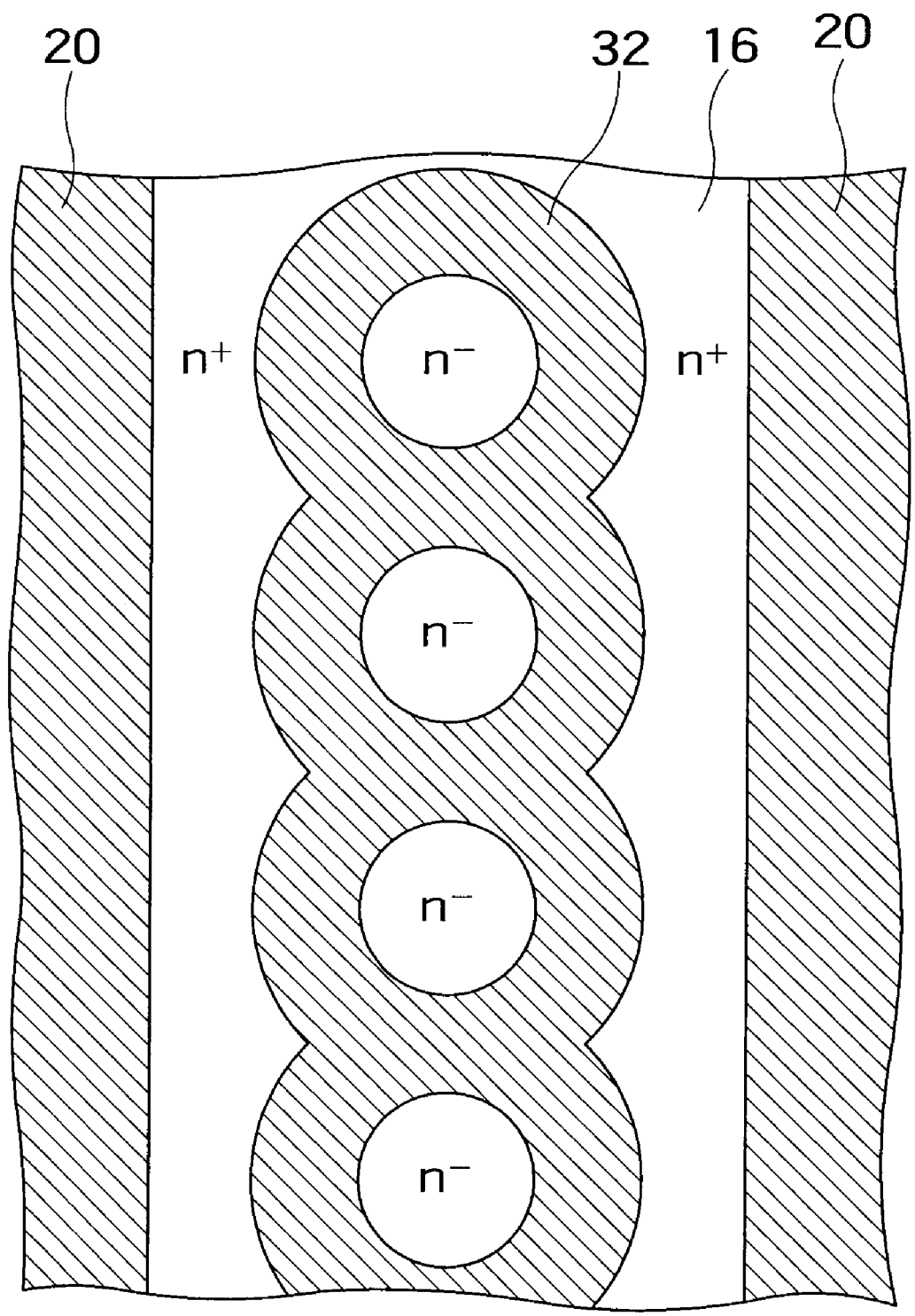
FIG. 13 is a plan view showing a third example of a plane shape of the gate electrode of the semiconductor device illustrated in FIG. 5.
Figure 14:
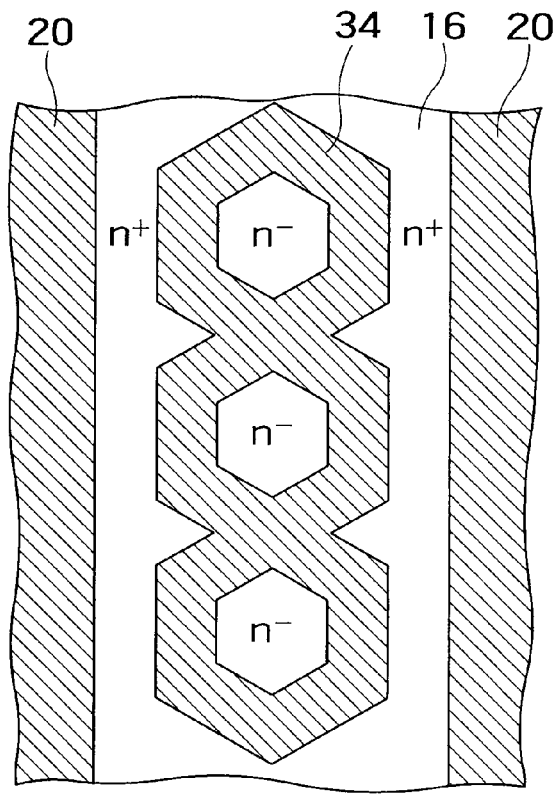
FIG. 14 is a plan view showing a fourth example of a plane shape of the gate electrode of the semiconductor device illustrated in FIG. 5.

As a solution to such drawback, the Njfet region 40 of the power MOSFET 5 is not formed in stripes in the longitudinal direction of the gate electrode 28 in the surface portion of the n$^-$ type high-resistance epitaxial layer 50. For example, as shown in a second example of FIG. 10, divided gate electrodes each having a hollow rectangular plane shape are disposed at regular intervals in the longitudinal direction, each Njfet region 40 just bellow the hollow rectangular is surrounded by the p type base layer 14, and divided gate electrodes are connected to each other at regular intervals so as to form a plane shape like a ladder in a region where the Njfet region 40 does not exist in the lower layer. Since the gate electrodes 28 are formed so as to surround the Njfet regions 40 disposed at regular intervals from the top view, resistance of the gate electrodes can be largely reduced. Further, depletion of the Njfet region 40 develops only in the horizontal direction of the drawing sheet in the example shown in FIG. 9. By disposing the Njfet regions 40 at regular intervals as shown in FIG. 10, depletion develops omnidirectionally. Consequently, operation speed of the device is further improved. FIG. 11 shows a schematic cross section taken along line A-A of FIG. 10, and FIG. 12 shows a schematic cross section taken along line B-B of FIG. 10.

In the example shown in FIG. 10, the shape of the Njfet region 40 surrounded by the p type base layer 14 is a rectangular shape. However, the shape of the Njfet region 40 is not limited to the rectangular shape but may be, for example, a circular shape 32 as a third example shown in FIG. 13 or a polygonal shape 34 as a fourth example show in FIG. 14.

(4) FOURTH EMBODIMENT

Figure 15:
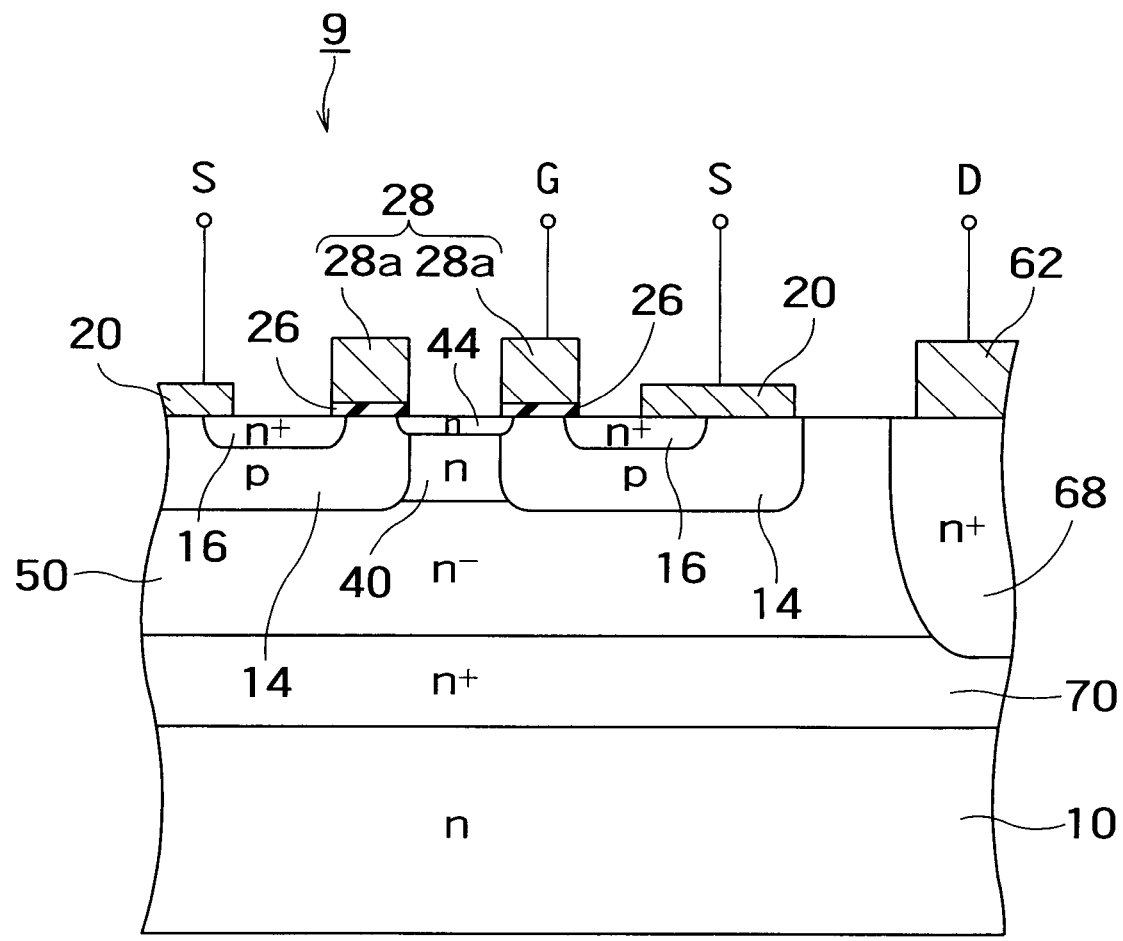
FIG. 15 is a schematic cross section showing a fourth embodiment of the semiconductor device according to the invention.

FIG. 15 is a schematic cross section showing a fourth embodiment of the semiconductor device according to the invention. A power MOSFET 9 shown in FIG. 15 is obtained by applying the foregoing third embodiment to a lateral-type power MOSFET. Specifically, in a region outside of the p type base layer 14, an n$^+$ type low-resistance drain layer 68 is formed so as to extend from the surface of the n$^-$ type high-resistance epitaxial layer 50 to an n$^+$ low-resistance semiconductor layer 70 just below the layer 50. A drain electrode 62 is provided on the surface of the n$^+$ type low-resistance drain layer 68, thereby constructing a vertical-type power MOSFET. The power MOSFET 9 is substantially the same as the power MOSFET 5 shown in FIG. 5 in that the Njfet region 40 sandwiched (or surrounded) by the p type base layer 14 is formed so that its width L is narrow, in that the Njfet region 40 is formed at high concentration, in that the gate electrode 28 is provided in a divided form, and in that the LDD region 44 is formed in the surface portion of the Njfet region 40.

(5) FIFTH EMBODIMENT

Figure 16:
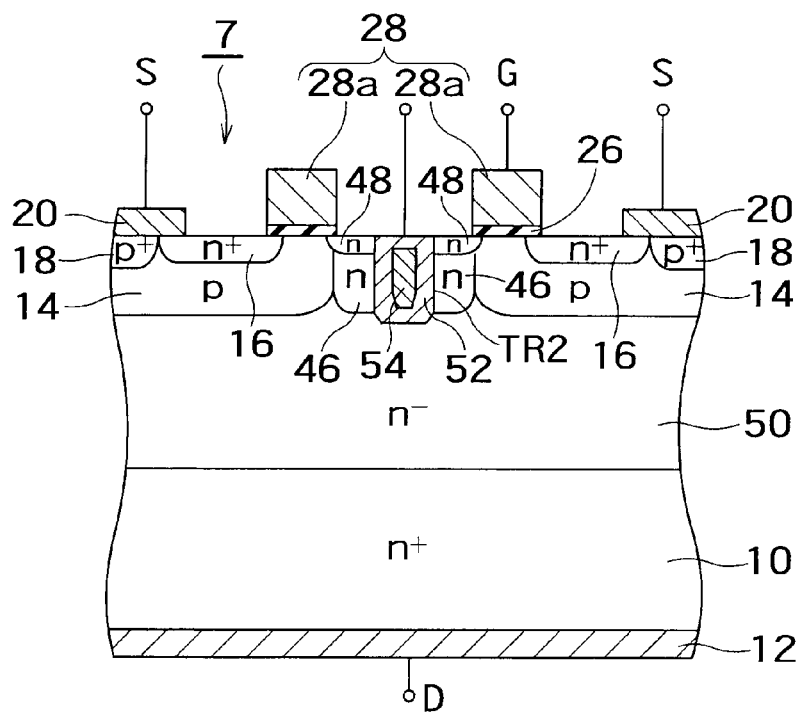
FIG. 16 is a schematic cross section showing a fifth embodiment of the semiconductor device according to the invention.

FIG. 16 is a schematic cross section showing a fifth embodiment of a semiconductor device according to the invention. A power MOSFET 7 shown in FIG. 16 is characterized in that it further includes an insulating film 52 formed in a trench TR2 provided with a depth which is approximately the same as diffusion depth of the p type base layer 14 in an almost center portion in the Njfet region 46 and it further includes an electrode 54 of a fixed potential provided in the insulating film 52.

By providing the trench TR2 in the Njfet region 46 sandwiched (or surrounded) by the p type base layer 14 as described above, ions can be implanted obliquely to the surface of the wafer. Consequently, the highly-doped Njfet region 46 can be formed in a fine structure on the side walls of the trench TR2. By providing the electrode 54 via the insulating film 52 in the trench TR2 and fixing the potential of the electrode 54, the breakdown voltage can be further increased by about 5V and the gate-drain capacitance $Q_{gd}$ can be further reduced by about 20%.

A method of manufacturing the power MOSFET 7 shown in FIG. 16 will be briefly described with reference to FIGS. 17 through 22.

Figure 17:
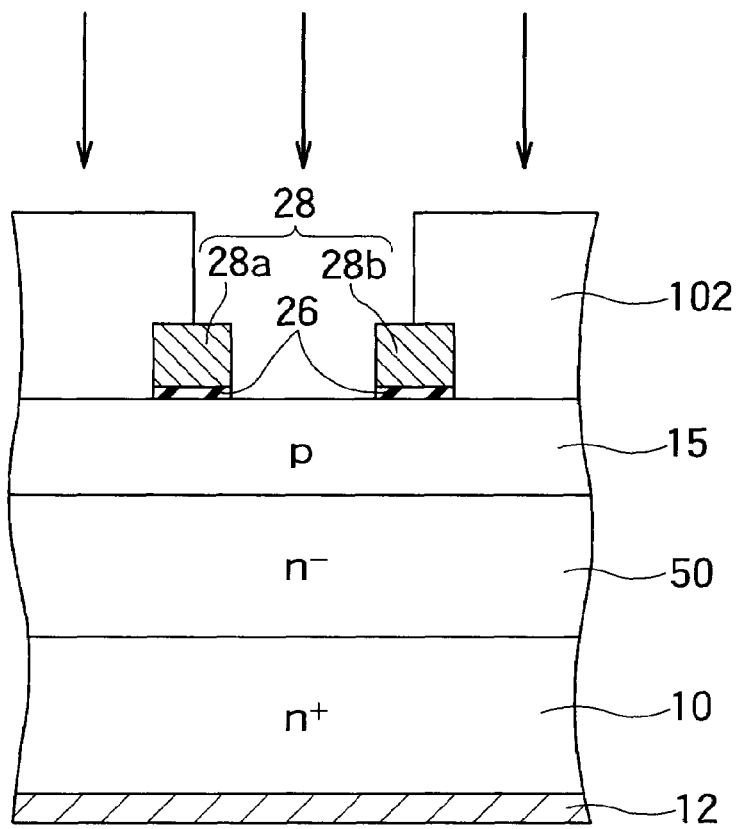
FIGS. 17 through 22 are schematic cross sections for explaining a method of manufacturing the semiconductor device shown in FIG. 16.

First, as shown in FIG. 17, an n$^-$ type high-resistance epitaxial layer 50 is formed on the top face of the n$^+$ type low-resistance semiconductor substrate 10 having the drain electrode 12 on its under face, and a p type base layer 15 is formed on the top face of the n$^-$ type epitaxial layer 50. Subsequently, a gate insulating film 26 and the gate electrode 28 are formed on the surface of the p type base layer 15. After that, the gate electrode 28 is divided into at least two parts. Subsequently, a photoresist 102 is formed, and n type impurities are selectively implanted between the divided gate electrodes 28a, thereby forming a shallow n-type lightly doped drain (LDD) region 48 so that its both ends face the divided gate electrodes 28a via the gate insulating film 26 (refer to FIG. 18). By making the ends of the LDD region 48 overlapped with the gate electrode 28 as described above, the gate-drain capacitance $Q_{gd}$ can be suppressed.

Figure 18:
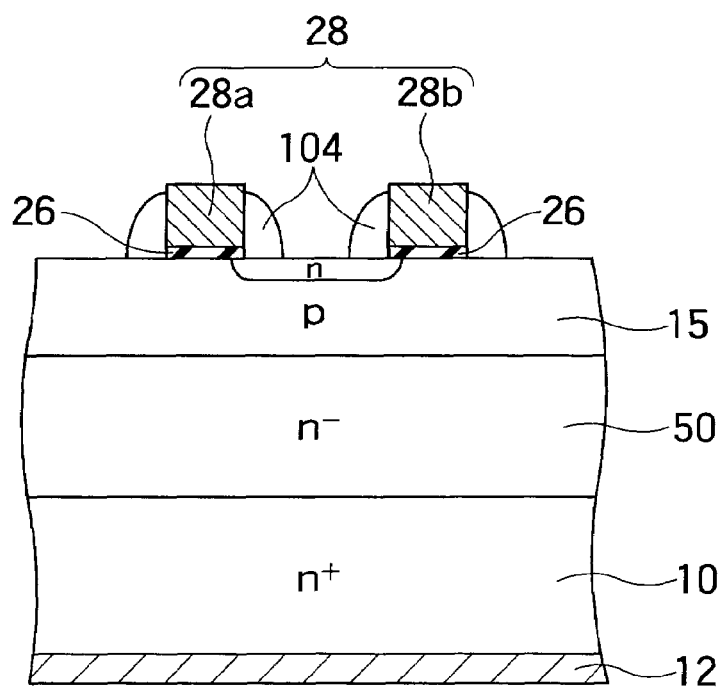

After removing the photoresist 102, an insulating film is deposited on the whole wafer and RIE (Reactive Ion Etching) is executed. By the operation, as shown in FIG. 18, the deposited insulating film can be left only on the side walls of the gate insulating film 26 and the gate electrodes 28a (side walls 104). As a material of the side walls 104, a conductive material such as polysilicon can be used in place of the insulating film. In this case, the gate electrode 28a has to be oxidized so as to be insulated from the conductive material by post-oxidation or the like.

Figure 19:
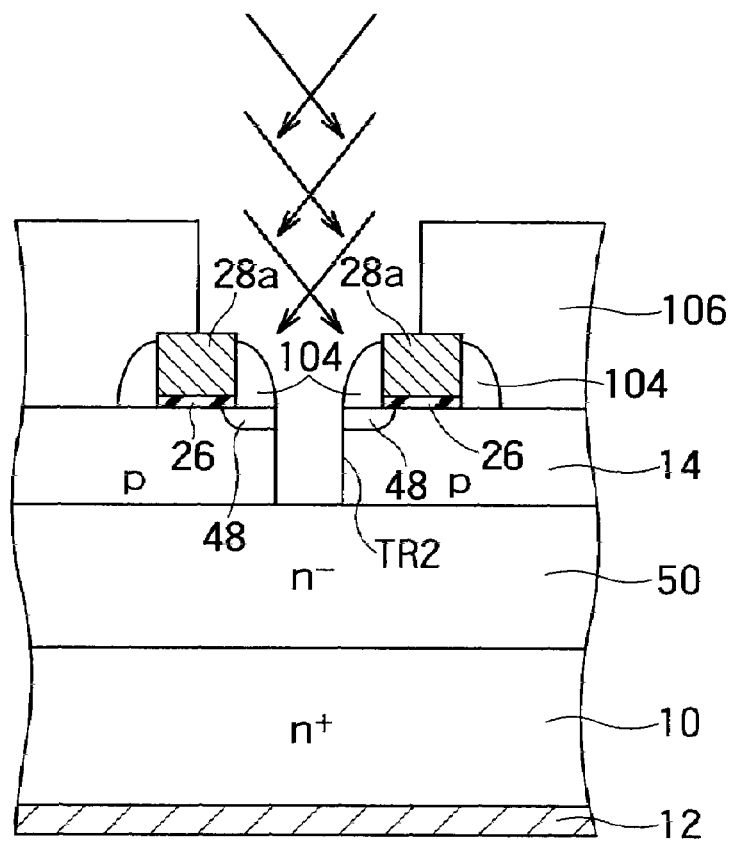
Figure 20:
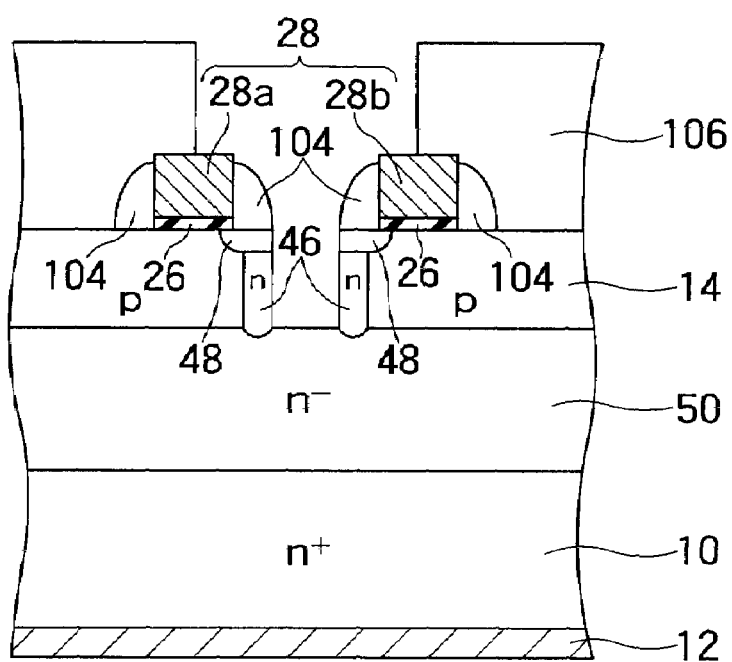

Next, as shown in FIG. 19, a photoresist 106 is formed. By using the photoresist 106 and the side walls 104 as a mask, the p type base layer 15 is selectively removed by RIE, thereby forming the trench TR2 with the ends of the LDD region 48 being retained by widths each of which corresponds to that of the side wall 104. Subsequently, n-type impurities are implanted at oblique angles to the wafer as shown by arrows in FIG. 19. Thus, the n type region 46 serving as an Njfet region is selectively formed only on the side walls of the trench TR2 (FIG. 20).

Figure 21:
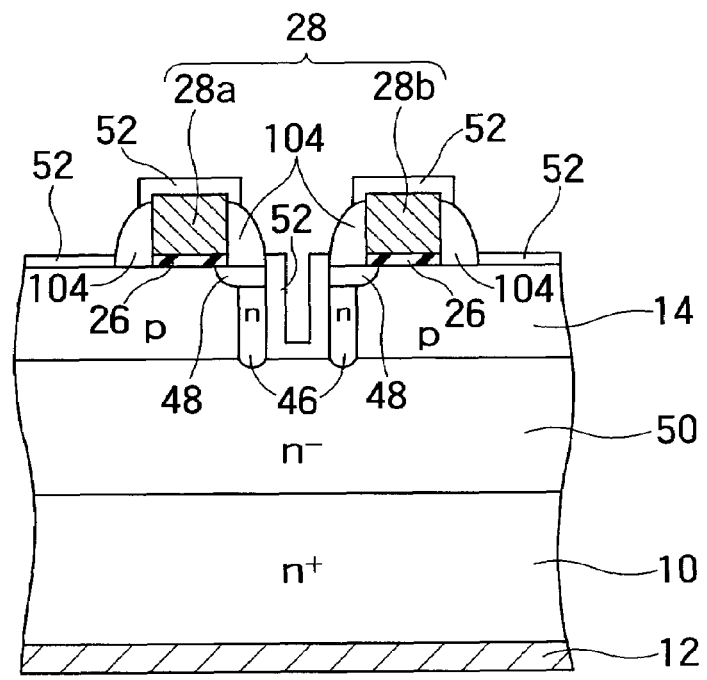

Subsequently, as shown in FIG. 21, the oxide film 52 is formed on the silicon on the surface of the wafer with an oxidizing process. If ions implanted in the side walls of the trench TR2 are, for example, of arsenic, the extent of thermal diffusion is less than in a case of phosphorus and, by speed-increased oxidization, the oxide film in the surface portion of arsenic can be formed thicker than that of the other silicon surface portion.

Figure 22:
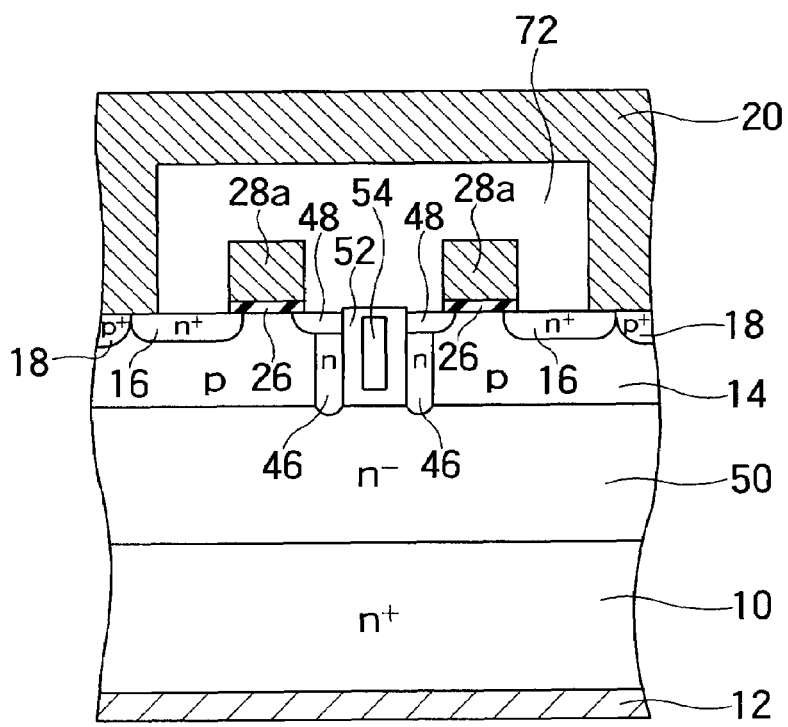

Further, as shown in FIG. 22, the trench TR2 is buried with the insulating film 52, or the insulating film 52 and a conductive material. Finally, an interlayer insulating film 72 and the source electrode 20 are formed.

By the processes, the size of the gate-drain overlap region below the gate electrode is minimized by the LDD region 48, and the highly-doped Njfet region 46 can be formed on the side walls of the trench TR2. By filling the trench TR2 with the insulating film or the conductive material via the insulating film 52 and connecting and fixing the electrode 54 made of the conductive material to the source potential or other potential, a field plate effect can be expected in the Njfet region 46 of the side walls of the trench TR2. As a result, depletion is promoted. The concentration of the Njfet region 46 of the side walls of the trench TR2 can thus be made higher than that of the drift layer necessary to obtain a breakdown voltage for an ordinary purpose. With the structures, remarkable reduction in the gate-drain capacitance $Q_{gd}$ and the on-state resistance $R_{on}$ can be realized.

The manufacturing method of the power MOSFET according to the embodiment is not limited to the above described method. For example, in place of the method of preliminarily forming the p type base layer 15 before dividing the gate electrode 28, p type impurities may be diffused only from the source region after division of the gate electrode 28. Also with respect to the shallow n-type LDD region 48, in place of the method of implanting n type impurities in the self-alignment process so that both ends of the LDD region 48 face the gate electrode 28a via the gate oxide film 26, the LDD region 48 may be formed by implanting after forming the trench TR or after forming the oxide film 52. In this case, the number of processes of thermal diffusion can be reduced, and the overlap of the gate and drain can be adjusted to the minimum amount.

(6) SIXTH EMBODIMENT

Figure 23:
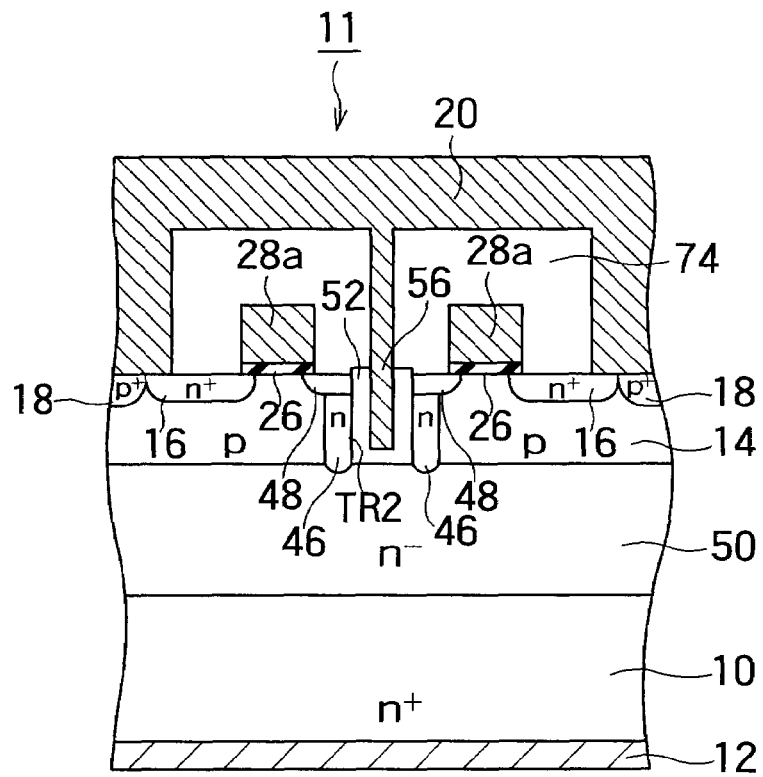
FIG. 23 is a schematic cross section showing a sixth embodiment of the semiconductor device according to the invention.

FIG. 23 is a schematic cross section showing a sixth embodiment of a semiconductor device according to the invention. A power MOSFET 11 shown in FIG. 23 is characterized in that the electrode 56 formed in the insulating film 52 in the trench TR2 is electrically connected to an upper part of the source electrode 20. With such a structure, the potential of the electrode 56 in the trench TR2 can be fixed to the potential of the source electrode 20.

(7) SEVENTH EMBODIMENT

Figure 24:
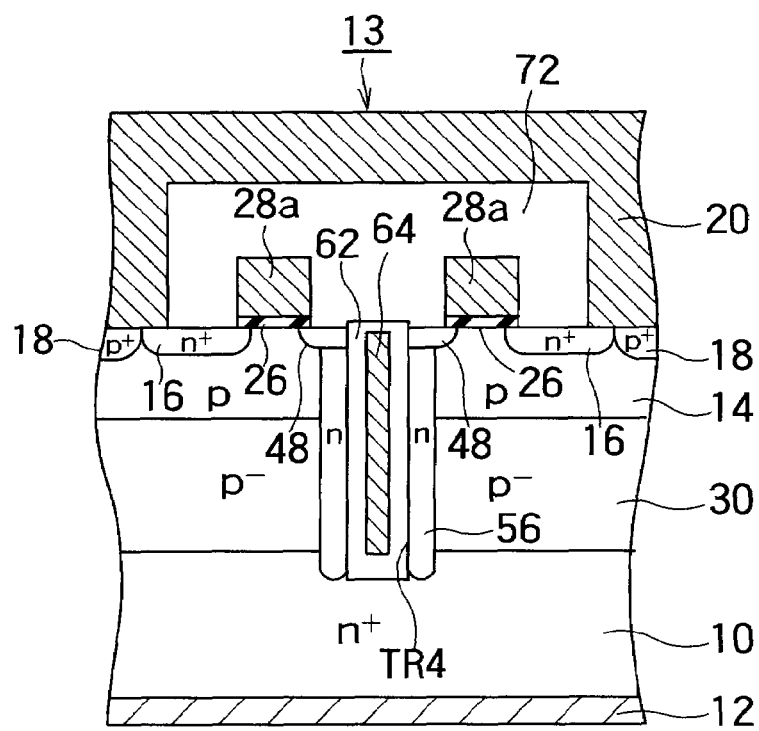
FIG. 24 is a schematic cross section showing a seventh embodiment of the semiconductor device according to the invention.

FIG. 24 is a schematic cross section showing a seventh embodiment of a semiconductor device according to the invention. A power MOSFET 13 shown in the diagram is characterized in that a trench TR4 is formed so deep as to reach the n$^+$ type semiconductor substrate 10 so that the n-type highly-doped region 56 of the side walls of the trench TR4 is directly connected to the n$^+$ type semiconductor substrate 10 and in that the n type highly doped region 56 is sandwiched by the insulating film 62 in the trench TR4 and the p$^-$ type region 30 on the outside of the trench TR4.

In the foregoing fifth and sixth embodiments, since the trench TR2 is formed with approximate same depth as that of the p-type base layer 14, the Njfet region 46 on the side walls of the trench also has to be formed with approximate same depth as the depth of the p-type base layer 14 for the following reason. If the trench is too shallow, a current path between the source and the drain is interrupted. On the other hand, if the trench is too deep, the impurity concentration of the n$^-$ type drain layer increases. In this case, it is concerned that a depletion layer does not extend and the breakdown voltage decreases.

Since the power MOSFET 13 of the seventh embodiment employs the structure in which the n type highly-doped region 56 serving as the Njfet region is sandwiched by the insulating film 62 in the trench TR4 and the p-type region 30 on the outside of the trench TR4, a current can directly pass to the n$^+$ type low-resistance semiconductor substrate 10 via no n$^-$ type drift layers, so that ON-state resistance can be decreased. With the configuration, the n-type highly-doped region 56 is therefore easily depleted and the depletion layer extends also to the p$^-$ type region 30. As a result, a desired breakdown voltage can be obtained.

Figure 25:
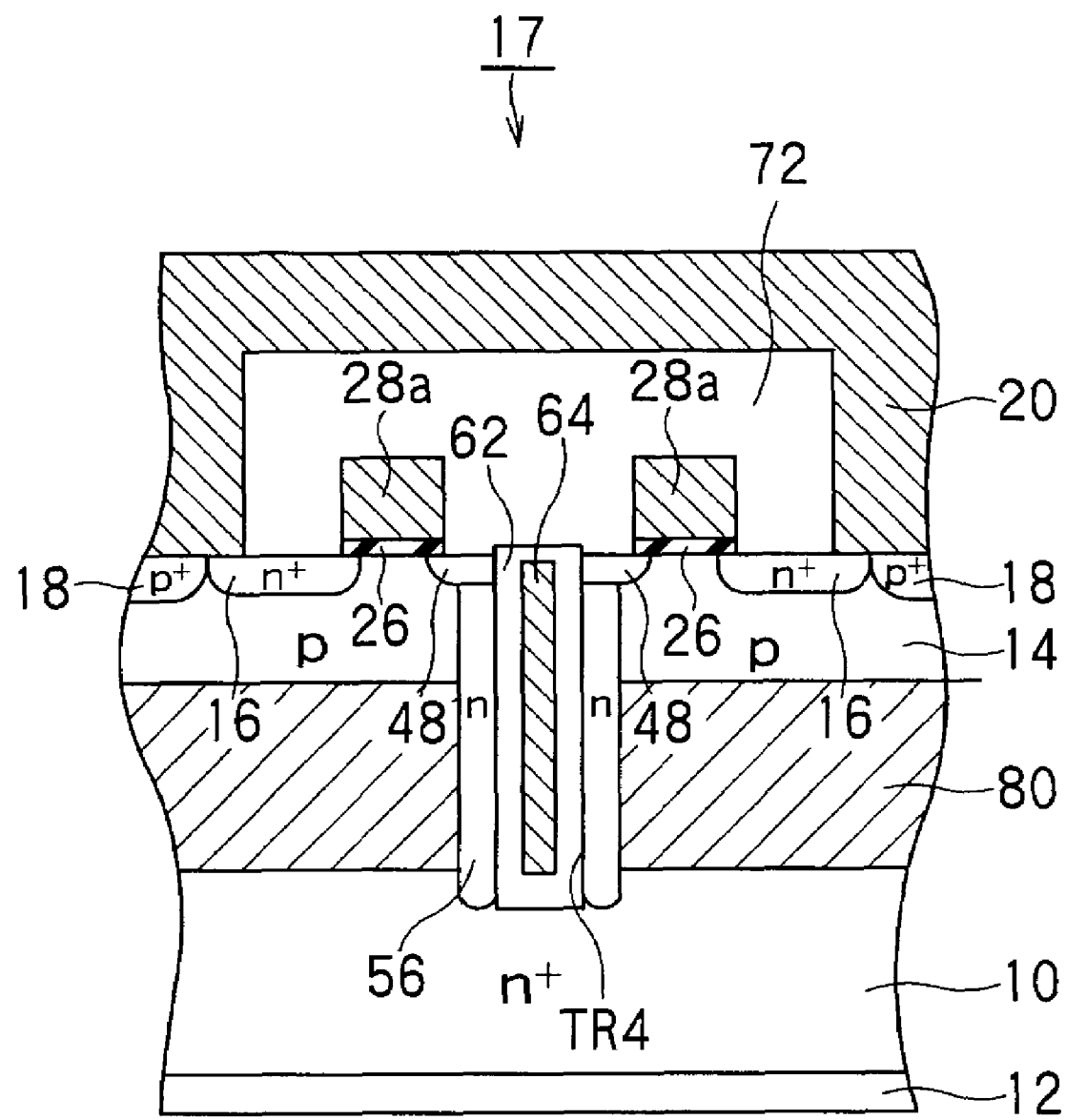
FIG. 25 is a schematic cross section showing a modification of the semiconductor device illustrated in FIG. 24.

FIG. 25 is a schematic cross section showing a modification of the seventh embodiment. A power MOSFET 17 shown in the diagram has an insulating layer 80 formed on the outside of the trench TR4 in place of the p$^-$ type region 30 formed on the outside of the trench TR4 in the power MOSFET 13 shown in FIG. 24. Even with such an insulating layer 80, the n type highly-doped region 56 on the side walls of the trench is depleted.

Since the third through seventh embodiments employ the structure in which the gate electrode is divided into two or more parts, there may occur a concern about increase in gate resistance. Examples of methods of eliminating such a concern include a method of metallizing the surface of a gate polysilicon electrode with a silicide process and a method of re-connecting the divided parts of the gate electrode in a terrace state in a wiring process to be performed after forming element regions.

Although the embodiments of the invention have been described above, it is obvious that the invention is not limited to the embodiments but can be variously modified within the scope and the spirit of the invention. For example, the case of selecting the n type as a first conductivity type has been described in the foregoing embodiments. Also when the invention is applied to a p-type channel device in which n and p are opposite to those of the embodiments, similar effects can be obtained.

What is claimed is:

1. A semiconductor device comprising:
   a low-resistance drain layer of a first conductivity type;
   a first main electrode connected to the low-resistance drain layer;
   a high-resistance epitaxial layer formed on the low-resistance drain layer;
   a second-conductivity type base layer selectively formed in a surface portion of the high-resistance epitaxial layer;
   a first-conductivity type source layer selectively formed in a surface portion of the second-conductivity type base layer;
   a JFET layer of the first conductivity type selectively formed in a region sandwiched by the second-conductivity type base layer and having an impurity concentration higher than that of the high-resistance epitaxial layer;
   an LDD layer of the first-conductivity type formed in a surface portion of the high-resistance epitaxial layer and in the region sandwiched by the second-conductivity type base layer so as to be connected to said first-conductivity type JFET layer;
   a gate insulating film covering the LDD layer and formed on at least a junction of the LDD layer and the second-conductivity type base layer, in the gate insulating film an opening being formed so as to expose a part of a surface of the LDD;

a control electrode formed on the gate insulating film; and;

a second main electrode in ohmic contact with the first-conductivity type source layer and the second-conductivity type base layer so as to sandwich the control electrode, wherein the second-conductivity type base layers sandwiching said first-conductivity type JFET layer are disposed close to each other so that depletion from the second-conductivity type base layer becomes dominant.

2. The semiconductor device according to claim 1, further comprising:

an insulating layer formed in said first-conductivity type JFET layer; and an electrode which is formed in the insulating layer so as to be covered with the insulating layer and to which a potential is fixed.

3. The semiconductor device according to claim 2, wherein the electrode in said first-conductivity type JFET layer is connected to the second main electrode.

4. The semiconductor device according to claim 2, further comprising:

a trench formed from the surface of the LDD layer at least to a depth in the high-resistance epitaxial layer and in said first-conductivity type JFET layer, the insulating layer being formed in said trench;

wherein the gate insulating film is formed so as to extend from the junction of the LDD layer and the second-conductivity type base layer to a junction of the second-conductivity type base layer and the first-conductivity type source layer in a direction orthogonal to a longitudinal direction of the control electrode.

5. The semiconductor device according to claim 4, wherein a bottom surface of the trench is substantially the same as that of the second-conductivity type base layer.

6. The semiconductor device according to claim 5, wherein the electrode in said first-conductivity type JFET layer is connected to the second main electrode.

7. A semiconductor device according to claim 5, wherein the high-resistance epitaxial layer is a layer of the first conductivity type.

8. The semiconductor device according to claim 4, wherein a bottom surface of the trench is located in the low-resistance drain layer.

9. The semiconductor device according to claim 8, wherein the high-resistance epitaxial layer is a layer of the second-conductivity type.

10. The semiconductor device according to claim 8, wherein the electrode in said trench is connected to the second main electrode.

11. The semiconductor device according to claim 1, wherein the high-resistance epitaxial layer is a layer of the first-conductivity type.

12. A semiconductor device comprising:

a semiconductor substrate, at least a surface portion thereof serving as a low-resistance drain layer of a first conductivity type;

a first main electrode connected to the low-resistance drain layer;

a high-resistance epitaxial layer formed on the low-resistance drain layer;

a second-conductivity type base layer selectively formed in a surface portion of the high-resistance epitaxial layer;

a first-conductivity type source layer selectively formed in a surface portion of the second-conductivity type base layer;

a JFET layer of the first conductivity type selectively formed in a region sandwiched by the second-conductivity type base layer and having impurity concentration higher than that of the high-resistance epitaxial layer;

a gate insulating film formed on at least a part of the surface of said first-conductivity type JFET layer, on the surfaces of the second-conductivity type base layers facing each other across said first-conductivity type JFET layer, and on the surfaces of end portions of the first-conductivity type source layers facing each other across said first-conductivity type JFET layer;

a control electrode formed on the gate insulating film;

a second main electrode in ohmic contact with the first-conductivity type source layer and the second-conductivity type base layer so as to sandwich the control electrode;

an insulating layer formed in said first-conductivity type JFET layer;

a trench formed from the surface of the semiconductor device at least to a depth in the high-resistance epitaxial layer and in a region sandwiched by the second-conductivity type base layers, the insulating layer being formed in said trench; and an LDD layer of the first-conductivity type formed in a surface portion of the second-conductivity type base layer so as to be connected to said first-conductivity type JFET layer around a top face of said trench, the JFET layer of the first conductivity type being formed on side walls of said trench;

wherein the second-conductivity type base layers sandwiching said first-conductivity type JFET layer are disposed close to each other so that depletion from the second-conductivity type base layer becomes dominant, the gate insulating film and the control electrode are formed by selectively removing a part of a region facing said first-conductivity type JFET layer, and the control electrode is formed above the semiconductor substrate so as to be divided into a plurality of parts, and formed on the gate insulating film formed on a part of the surface of said LDD layer, on surfaces of end parts of the first-conductivity type source layer facing each other across said trench, and on a region of the surface of the second-conductivity type base layer sandwiched by said LDD layer and the first-conductivity type source layer.

13. The semiconductor device according to claim 12, further comprising an electrode which is formed in said trench so as to be covered with the insulating layer and to which a potential is fixed.

14. The semiconductor device according to claim 13, wherein the electrode in said first-conductivity type JFET layer is connected to the second main electrode.

15. The semiconductor device according to claim 13, wherein the high-resistance epitaxial layer is a layer of the first-conductivity type.

16. The semiconductor device according to claim 12, wherein a bottom surface of the trench is located in the low-resistance drain layer.

17. The semiconductor device according to claim 16, further comprising an electrode which is formed in said trench so as to be covered with the insulating layer and to which a potential is fixed.

18. The semiconductor device according to claim 16, wherein the high-resistance epitaxial layer is a layer of the second-conductivity type.

* * * * *